(12) United States Patent
Anderson et al.

(10) Patent No.: US 11,036,648 B2
(45) Date of Patent: *Jun. 15, 2021

(54) HIGHLY INTEGRATED SCALABLE, FLEXIBLE DSP MEGAMODULE ARCHITECTURE

(71) Applicant: TEXAS INSTRUMENTS INCORPORATED, Dallas, TX (US)

(72) Inventors: Timothy D. Anderson, University Park, TX (US); Joseph Zbiciak, San Jose, CA (US); Duc Quang Bui, Grand Prairie, TX (US); Abhijeet Chachad, Plano, TX (US); Kai Chirca, Dallas, TX (US); Naveen Bhoria, Plano, TX (US); Matthew D. Pierson, Murphy, TX (US); Daniel Wu, Plano, TX (US); Ramakrishnan Venkatasubramanian, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/227,238

(22) Filed: Dec. 20, 2018

(65) Prior Publication Data
US 2019/0146790 A1 May 16, 2019

Related U.S. Application Data

(60) Continuation of application No. 15/429,205, filed on Feb. 10, 2017, now Pat. No. 10,162,641, which is a
(Continued)

(51) Int. Cl.
*G06F 9/34* (2018.01)
*G06F 11/00* (2006.01)
(Continued)

(52) U.S. Cl.
CPC ...... *G06F 12/1045* (2013.01); *G06F 9/30014* (2013.01); *G06F 9/3016* (2013.01);
(Continued)

(58) Field of Classification Search
CPC ............ G06F 9/30014; G06F 9/30036; G06F 9/30098; G06F 9/30112; G06F 9/30145;
(Continued)

(56) References Cited

U.S. PATENT DOCUMENTS

| 4,128,876 A | 12/1978 | Ames et al. |
| 5,181,207 A | 1/1993 | Chapman |

(Continued)

*Primary Examiner* — Daniel H Pan
(74) *Attorney, Agent, or Firm* — Brian D. Graham; Charles A. Brill; Frank D. Cimino

(57) ABSTRACT

Disclosed embodiments include a data processing apparatus having a processing core, a memory, and a streaming engine. The streaming engine is configured to receive a plurality of data elements stored in the memory and to provide the plurality of data elements as a data stream to the processing core, and includes an address generator to generate addresses corresponding to locations in the memory, a buffer to store the data elements received from the locations in the memory corresponding to the generated addresses, and an output to supply the data elements received from the memory to the processing core as the data stream.

21 Claims, 20 Drawing Sheets

Related U.S. Application Data division of application No. 14/331,986, filed on Jul. 15, 2014, now Pat. No. 9,606,803.

(60) Provisional application No. 61/846,148, filed on Jul. 15, 2013.

(51) Int. Cl.

| | |
|---|---|
| *G06F 12/0875* | (2016.01) |
| *G06F 12/1045* | (2016.01) |
| *G06F 9/30* | (2018.01) |
| *G06F 9/345* | (2018.01) |
| *G06F 9/38* | (2018.01) |
| *G06F 11/10* | (2006.01) |
| *G06F 9/32* | (2018.01) |
| *G06F 12/0897* | (2016.01) |
| *G06F 12/0862* | (2016.01) |
| *G06F 12/1009* | (2016.01) |

(52) U.S. Cl.
CPC ...... *G06F 9/30036* (2013.01); *G06F 9/30098* (2013.01); *G06F 9/30112* (2013.01); *G06F 9/30145* (2013.01); *G06F 9/32* (2013.01); *G06F 9/345* (2013.01); *G06F 9/3802* (2013.01); *G06F 9/383* (2013.01); *G06F 9/3867* (2013.01); *G06F 11/00* (2013.01); *G06F 11/1048* (2013.01); *G06F 12/0862* (2013.01); *G06F 12/0875* (2013.01); *G06F 12/0897* (2013.01); *G06F 12/1009* (2013.01); *G06F 9/3822* (2013.01); *G06F 11/10* (2013.01); *G06F 2212/452* (2013.01); *G06F 2212/60* (2013.01); *G06F 2212/602* (2013.01); *G06F 2212/68* (2013.01)

(58) Field of Classification Search
CPC .......... G06F 9/3016; G06F 9/32; G06F 9/345; G06F 9/3802; G06F 9/383; G06F 9/3867; G06F 9/3822; G06F 9/30025; G06F 9/30032; G06F 9/30018; G06F 9/3897; G06F 9/3887; G06F 12/1045; G06F 12/0862; G06F 12/0875; G06F 12/0897; G06F 12/1009; G06F 11/00; G06F 11/1048; G06F 11/10; G06F 2212/452; G06F 2212/60; G06F 2212/602; G06F 2212/68; G06F 7/4806; G06F 7/4812; G06F 7/4824; G06F 7/4994; G06F 7/495; G06F 7/483

USPC .......... 712/4–6, 22, 201, 221–225, 300, 35; 711/117, 119, 122; 708/511, 622

See application file for complete search history.

(56) References Cited

U.S. PATENT DOCUMENTS

| | | | |
|---|---|---|---|
| 6,418,489 B1 | 7/2002 | Mason et al. | |
| 6,539,467 B1* | 3/2003 | Anderson | G06F 9/30014 711/149 |
| 6,553,462 B2* | 4/2003 | Arimilli | G06F 12/0831 711/118 |
| 6,789,172 B2* | 9/2004 | Chauvel | G06F 1/206 711/144 |
| 6,829,696 B1* | 12/2004 | Balmer | G06F 9/30036 712/222 |
| 6,832,296 B2 | 12/2004 | Hooker | |
| 6,874,039 B2 | 3/2005 | Ganapathy et al. | |
| 9,606,803 B2* | 3/2017 | Anderson | G06F 9/30112 |
| 10,162,641 B2* | 12/2018 | Anderson | G06F 9/30036 |
| 10,203,958 B2* | 2/2019 | Zbiciak | G06F 9/34 |
| 10,592,339 B2* | 3/2020 | Zbiciak | G06F 9/383 |
| 2004/0078523 A1* | 4/2004 | Chauvel | G06F 12/0253 711/128 |
| 2005/0125635 A1* | 6/2005 | Symes | G06F 9/30032 712/221 |
| 2005/0125647 A1* | 6/2005 | Symes | G06F 7/768 712/300 |
| 2005/0283589 A1 | 12/2005 | Matsuo | |
| 2006/0031610 A1* | 2/2006 | Liav | G06F 11/1076 710/66 |
| 2009/0006753 A1* | 1/2009 | Luick | G06F 12/0897 711/122 |
| 2009/0138661 A1 | 5/2009 | Lauterbach | |
| 2010/0011162 A1 | 1/2010 | Wang et al. | |
| 2018/0365122 A1* | 12/2018 | Zbiciak | G06F 9/30112 |

\* cited by examiner

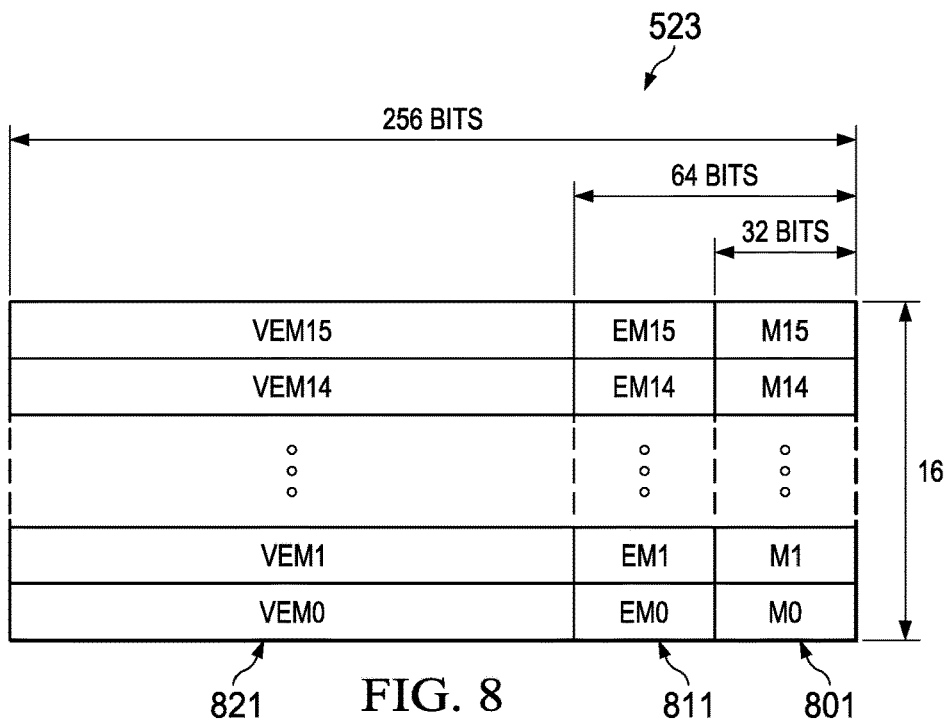
FIG. 8
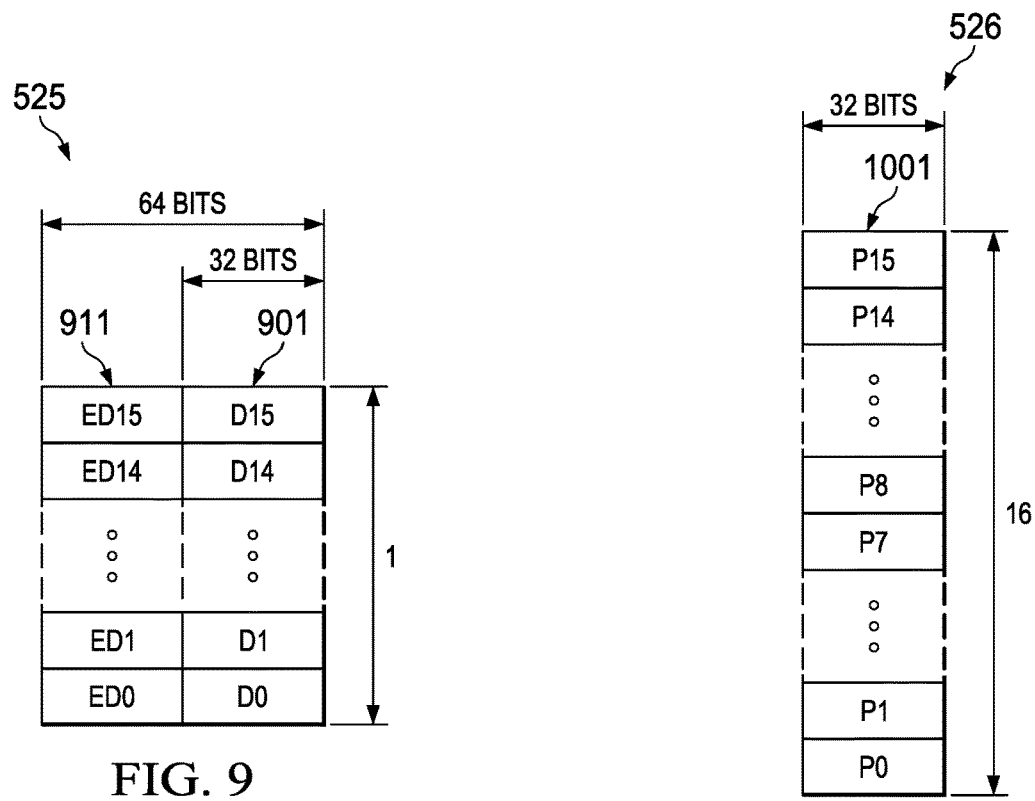
FIG. 9
FIG. 10

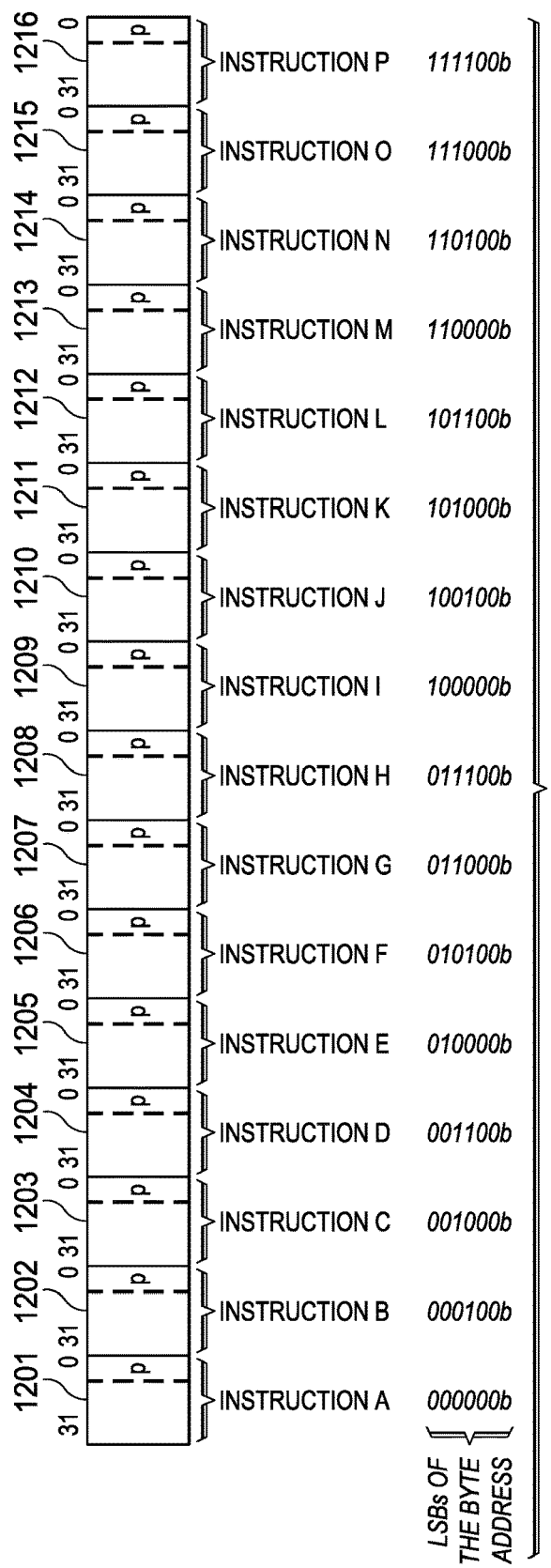
FIG. 12
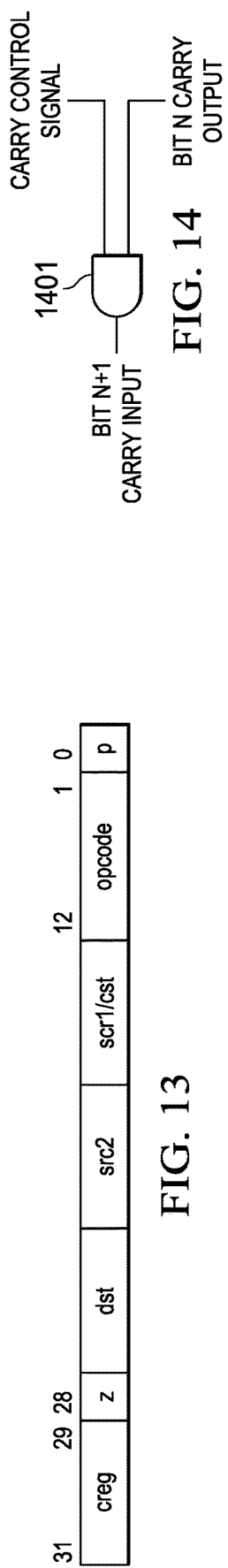
FIG. 14
FIG. 13

HIGHLY INTEGRATED SCALABLE, FLEXIBLE DSP MEGAMODULE ARCHITECTURE

CROSS-REFERENCE TO RELATED APPLICATIONS

This application is a continuation of U.S. patent application Ser. No. 15/429,205 filed on Feb. 10, 2017 (now U.S. Pat. No. 10,162,641), which is a divisional of U.S. patent application Ser. No. 14/331,986 filed on Jul. 15, 2014 (now U.S. Pat. No. 9,606,803), which claims priority to U.S. Provisional Application No. 61/846,148 filed Jul. 15, 2013, all of which are incorporated herein by reference.

TECHNICAL FIELD

The technical field of this invention relates to digital data processing and more specifically to a family of scalable, multicore digital signal processors.

BACKGROUND

Modern digital signal processors (DSP) face multiple challenges. Workloads continue to increase, requiring increasing bandwidth. Systems on a chip (SOC) continue to grow in size and complexity. Memory system latency severely impacts certain classes of algorithms. As transistors get smaller, memories and registers become less reliable. As software stacks get larger, the number of potential interactions and errors becomes larger. Even wires become an increasing challenge. Wide busses are difficult to route. Wire speeds continue to lag transistor speeds. Routing congestion is a continual challenge.

To a first order, bus bandwidth is proportional to the width of the bus in bits times the bus clock rate. To increase bandwidth to the processor required a wider bus running at a faster clock rate. However, that can lead to more wires and greater latency, because faster clock rates typically require greater pipelining. More wires produce more routing issues. The foregoing leads to either lower clock rates, overly large chips or both.

Memory systems continue to provide scalability challenges to the central processing unit (CPU). In the Texas Instruments C6600 family of DSPs, the level one data (L1D) cache line is 64 bytes long, and the CPU can consume 16 bytes per cycle. That means for high-bandwidth streaming workloads that include no significant data reuse), the CPU can consume an entire cache line every 4 cycles. It costs a minimum of 7 cycles to read a new line into the cache on this family of DSPs. Generally more cycles are needed. Streaming workloads pay a very large cache penalty even if all their data resides in level two (L2) RAM. The in-order nature of the CPU limits the ability to hide this latency penalty.

The level two (L2) cache lines for this DSP family are 128 bytes long. Due to limited buffering the L2 controller can only issues four L2 line fetches at a time. The round trip latency to fulfill those fetches, though, ranges from about 20 cycles for multicore shared memory controller (MSMC) RAM to possibly hundreds of cycles for a third level dual data rate memory (DDR3). A prefetcher helps, but is has a limited number of outstanding prefetches. Assuming a 100 cycle round-trip latency, a maximum of 12 outstanding line fill requests or prefetches outstanding (48 dataphases total), and a 256-bit bus operating at the CPU clock rate, the bus utilization only reach about 48%. Thus even the best-case peak gets poor bus bandwidth utilization. Deeper buffering could help. The in-order nature of the CPU would make using deeper buffering difficult. Real world usage patterns would produce far lower bus utilization.

One way to avoid cache overheads is to transfer data directly into the DSP's local memories (L1D and L2 RAM). The C6600 family of DSP provides an SDMA port permitting system peripherals to read and write the DSP's local memories. However, the SDMA busses are completely separate from the busses used by the caches. Thus the SDMA busses are smaller and slower than peak applications require. The C6600 family of DSPs has similar bus duplication to keep demand traffic, direct memory access (DMA) traffic and snoop traffic separate.

Thus memory system overheads limit performance and traditional approaches don't scale well. Applications continue to demand increasing performance. In addition to raw performance, todays SoCs also present interesting software integration challenges such as: communication between general-purpose operating systems OSes and the DSP (coherency); addressing large amounts of memory (large physical address); and isolating distinct tasks from each other (system integrity). Existing DSPs provide workable, if sub-par solutions to these problems.

The C6600 family of DSPs do not provide system-level hardware coherency. They rely on software handshakes and software-managed coherence between processors, system hardware, and general purpose OSes running on other processors. This technique works and leads to simpler, easier to verify hardware, but it imposes a large software overhead in terms of complexity and run-time cost.

The C6600 family of DSPs use a static address translation scheme, MPAX (Memory Protection and Address eXtension) to map each a DSP 32-bit virtual address space into the a system 36-bit address space. The MPAX unit is limited to providing 16 programmable address remap ranges. The MPOAX does not fit well with more traditional general purpose OS memory management. The MPAX translation happens after the cache hierarchy, so the caches effectively cache virtual addresses. This makes it very expensive to dynamically update the MPAX mappings. Thus software usually employs a static mapping for each DSP. While this allows isolating individual DSPs from each other, it doesn't allow isolating different tasks on the same DSP easily. Future application workloads will not only want to put more tasks on the DSP, but also have those tasks communicate directly with tasks running under a traditional virtual memory operating system such as running on a traditional general-purpose processor. Larger systems might even want to add virtualization so that multiple virtual machines need to interact with all of the DSPs.

BRIEF SUMMARY

This invention addresses the above noted challenges by integrating a range of interesting technologies into a single block. This combination directly attacks the interlinked issues raised above. Each DSP CPU has a streaming engine (SE) and vector support. Each DSP CPU includes efficient vector compute; scoreboarded loads, speculative loads and software directed prefetch. The streaming engines include: a SE to level two cache (L2) interface that can request 512 bits/cycle from L2; a loose binding between SE and L2 interface, to allow a single stream to peak at 1024 bits/cycle; one-way coherence where the SE sees all earlier writes cached in system, but not writes that occur after stream opens; full protection against single-bit data errors within its internal storage via single-bit parity with semi-automatic restart on parity error; a full modified, exclusive, shared, invalid (MESI) coherence to maintain coherence with L2 RAM, external shared MSMC RAM and data cached in L2 cache from other places in system. This invention employs a credit based bidirectional bus protocol used both internally and for external interface. This credit system ensures blocking requests such as allocations and victims cannot interfere with non-blocking requests such as snoop responses.

Multiple CPUs in the same block make better use of all wires leading to that block. For systems that have a high compute to bandwidth ratio, it makes sense to integrate more cores in each System On Chip (SOC). In other systems a different tradeoff might be better. By allowing a mix of vector and scalar processors, a system architect can cater to the exact mix of control, compute and bandwidth requirements of a system.

Scoreboarded loads, speculative loads and software prefetches all allow the processor to get more read requests and therefore cache misses in flight, hiding more memory system latency and improving bus utilization.

Streaming engines allow aggressively prefetching data ahead of the CPU bypassing the level one data (L1D) cache. Four streaming engines can sustain reading 2048 bits/cycle to L2 RAM/cache. A single streaming engine can use the maximum bandwidth of the MSMC RAM interface. Two streaming engines should be able use the maximum bandwidth of a single DDR3 interface.

BRIEF DESCRIPTION OF THE DRAWINGS

These and other aspects of this invention are illustrated in the drawings, in which:

FIG. 8 illustrates a local vector register file shared by multiply and correlation functional units;

FIG. 9 illustrates a local register file of a load/store unit;

FIG. 10 illustrates a predicate register file;

FIG. 12 illustrates sixteen instructions of a single fetch packet;

FIG. 13 illustrates an example of the instruction coding of instructions used by this invention;

FIG. 14 illustrates the carry control for SIMD operations according to this invention;

DETAILED DESCRIPTION

Figure 1:
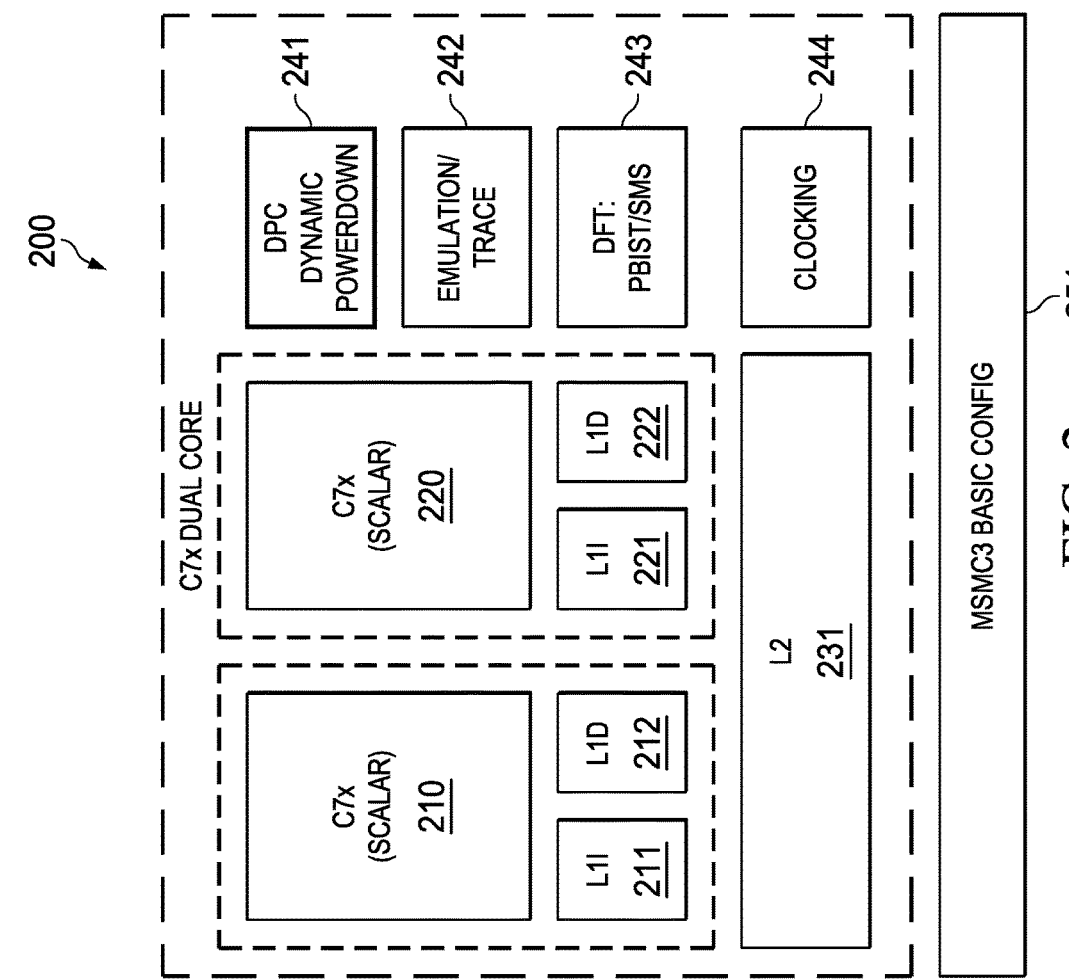
FIG. 1 illustrates a single core scalar processor according to one embodiment of this invention.

FIG. 1 illustrates a single core scalar processor according to one embodiment of this invention. Single core processor 100 includes a scalar central processing unit (CPU) 110 coupled to separate level one instruction cache (L1I) 111 and level one data cache (L1D) 112. Central processing unit core 110 could be constructed as known in the art and would typically include a register file, an integer arithmetic logic unit, an integer multiplier and program flow control units. Single core processor 100 includes a level two combined instruction/data cache (L2) 113 that holds both instructions and data. In the preferred embodiment scalar central processing unit (CPU) 110, level one instruction cache (L1I) 111, level one data cache (L1D) 112 and level two combined instruction/data cache (L2) 113 are formed on a single integrated circuit.

In a preferred embodiment this single integrated circuit also includes auxiliary circuits such as power control circuit 121, emulation/trace circuits 122, design for test (DST) programmable built-in self test (PBIST) circuit 123 and clocking circuit 124. External to CPU 110 and possibly integrated on single integrated circuit 100 is memory controller 131.

CPU 110 operates under program control to perform data processing operations upon defined data. The program controlling CPU 110 consists of a plurality of instructions that must be fetched before decoding and execution. Single core processor 100 includes a number of cache memories. FIG. 1 illustrates a pair of first level caches. Level one instruction cache (L1I) 111 stores instructions used by CPU 110. CPU 110 first attempts to access any instruction from level one instruction cache 121. Level one data cache (L1D) 112 stores data used by CPU 110. CPU 110 first attempts to access any required data from level one data cache 112. The two level one caches (L1I 111 and L1D 112) are backed by a level two unified cache (L2) 113. In the event of a cache miss to level one instruction cache 111 or to level one data cache 112, the requested instruction or data is sought from level two unified cache 113. If the requested instruction or data is stored in level two unified cache 113, then it is supplied to the requesting level one cache for supply to central processing unit core 110. As is known in the art, the requested instruction or data may be simultaneously supplied to both the requesting cache and CPU 110 to speed use.

Level two unified cache 113 is further coupled to higher level memory systems via memory controller 131. Memory controller 131 handles cache misses in level two unified cache 113 by accessing external memory (not shown in FIG. 1). Memory controller 131 handles all memory centric functions such as cacheabilty determination, error detection and correction, address translation and the like. Single core processor 100 may be a part of a multiprocessor system. In that case memory controller 131 handles data transfer between processors and maintains cache coherence among processors.

Figure 2:
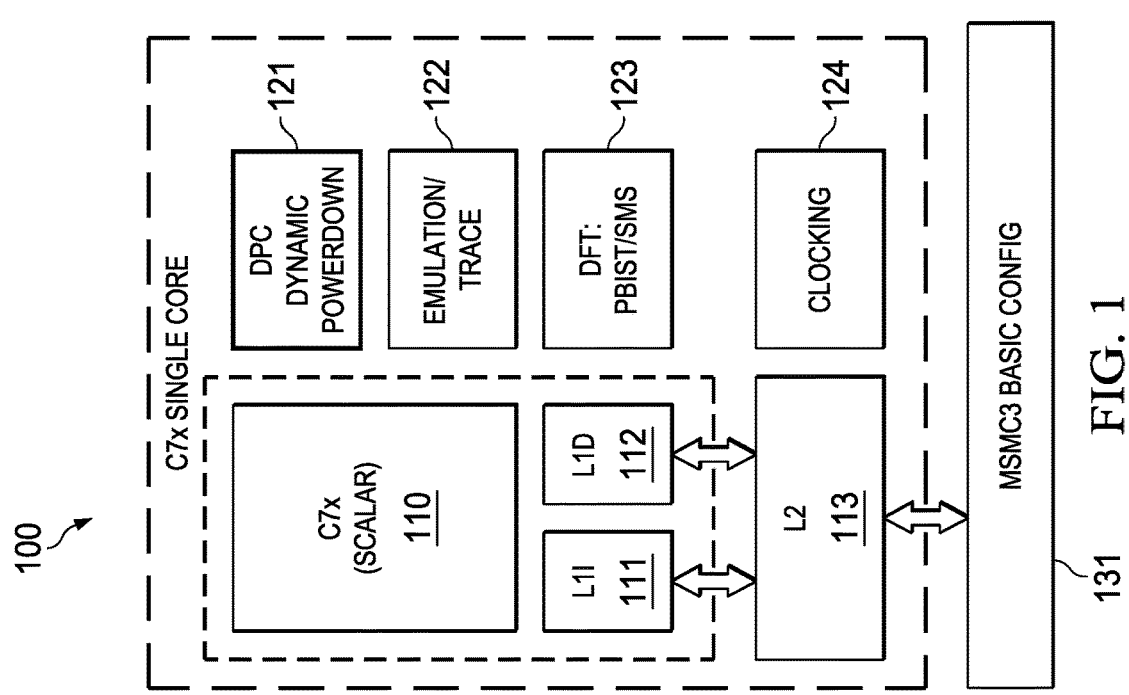
FIG. 2 illustrates a dual core scalar processor according to another embodiment of this invention.

FIG. 2 illustrates a dual core processor according to another embodiment of this invention. Dual core processor 200 includes first CPU 210 coupled to separate level one instruction cache (L1I) 211 and level one data cache (L1D) 212 and second CPU 220 coupled to separate level one instruction cache (L1I) 221 and level one data cache (L1D) 212. Central processing units 210 and 220 are preferably constructed similar to CPU 110 illustrated in FIG. 1. Dual core processor 200 includes a single shared level two combined instruction/data cache (L2) 231 supporting all four level one caches (L1I 211, L1D 212, L1I 221 and L1D 222). In the preferred embodiment CPU 210, level one instruction cache (L1I) 211, level one data cache (L1D) 212, CPU 220, level one instruction cache (L1I) 221, level one data cache (L1D) 222 and level two combined instruction/data cache (L2) 231 are formed on a single integrated circuit. This single integrated circuit preferably also includes auxiliary circuits such as power control circuit 241, emulation/trace circuits 242, design for test (DST) programmable built-in self test (PBIST) circuit 243 and clocking circuit 244. This single integrated circuit may also include memory controller 251.

Figure 3:
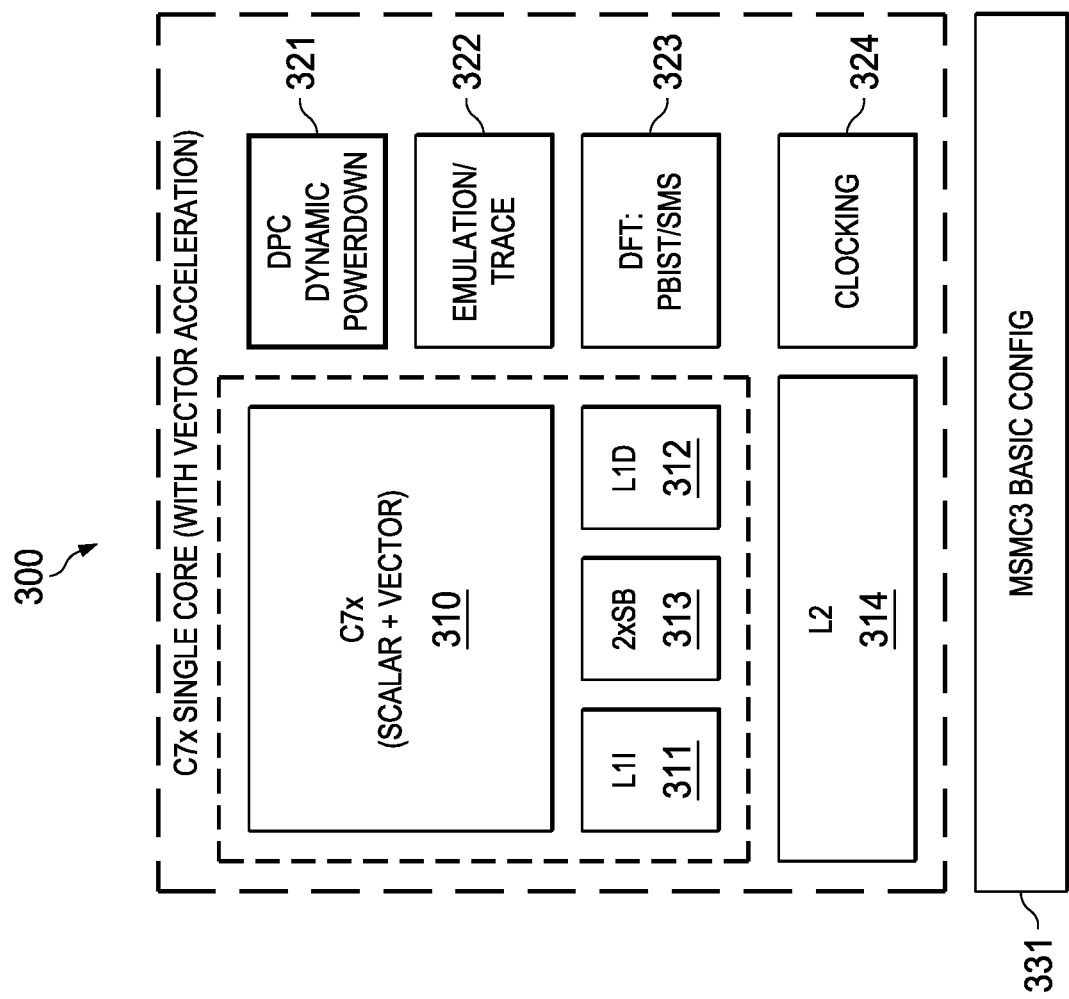
FIG. 3 illustrates a single core vector processor according to a further embodiment of this invention.
Figure 4:
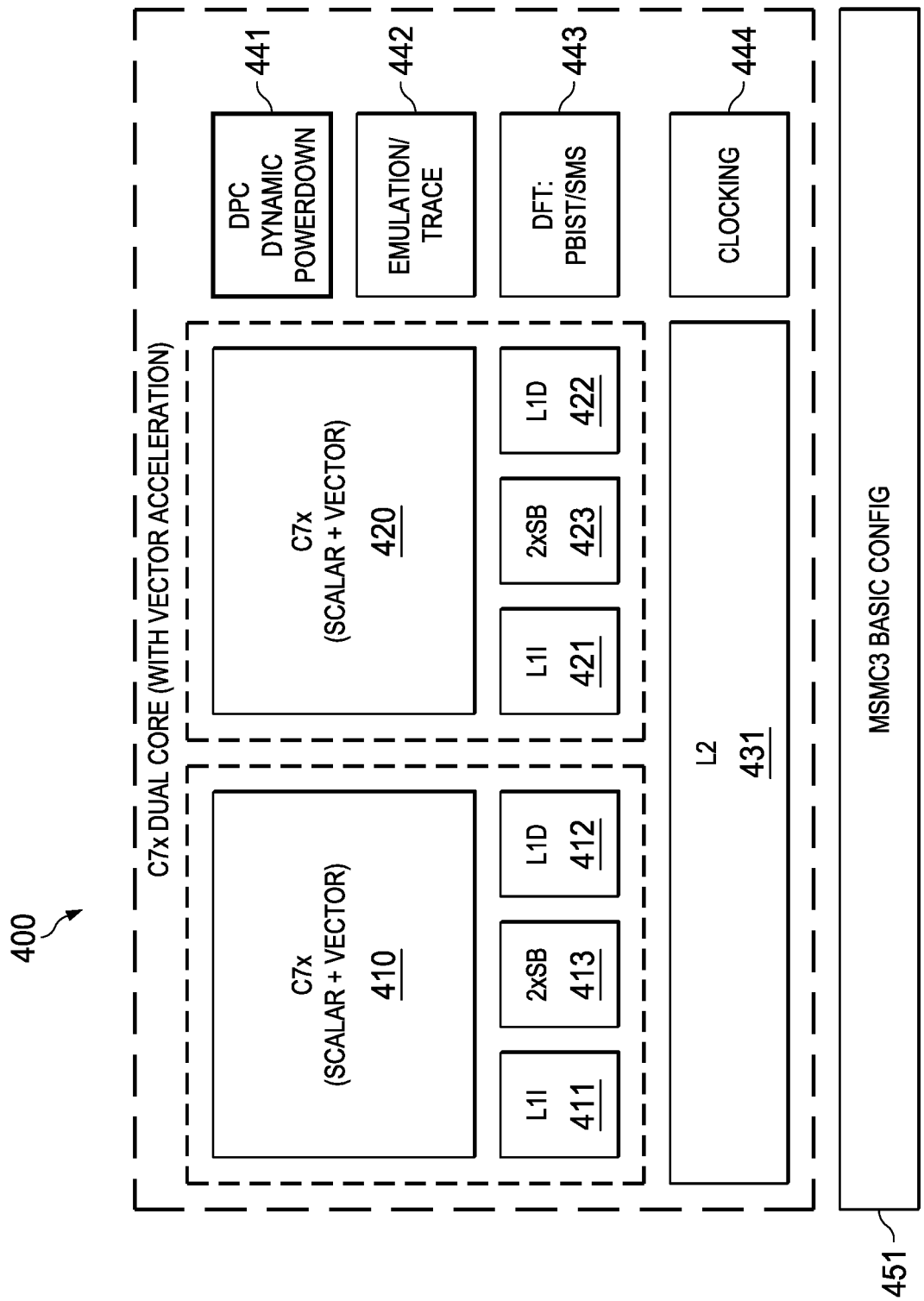
FIG. 4 illustrates a dual core vector processor according to a further embodiment of this invention.

FIGS. 3 and 4 illustrate single core and dual core processors similar to that shown respectively in FIGS. 1 and 2. FIGS. 3 and 4 differ from FIGS. 1 and 2 in showing vector central processing units. As further described below, single core vector processor 300 includes a vector CPU 310. Dual core vector processor 400 includes two vector CPUs 410 and 420. Vector CPUs 310, 410 and 420 include wider data path operational units and wider data registers than the corresponding scalar CPUs 110, 210 and 220.

Figure 5:
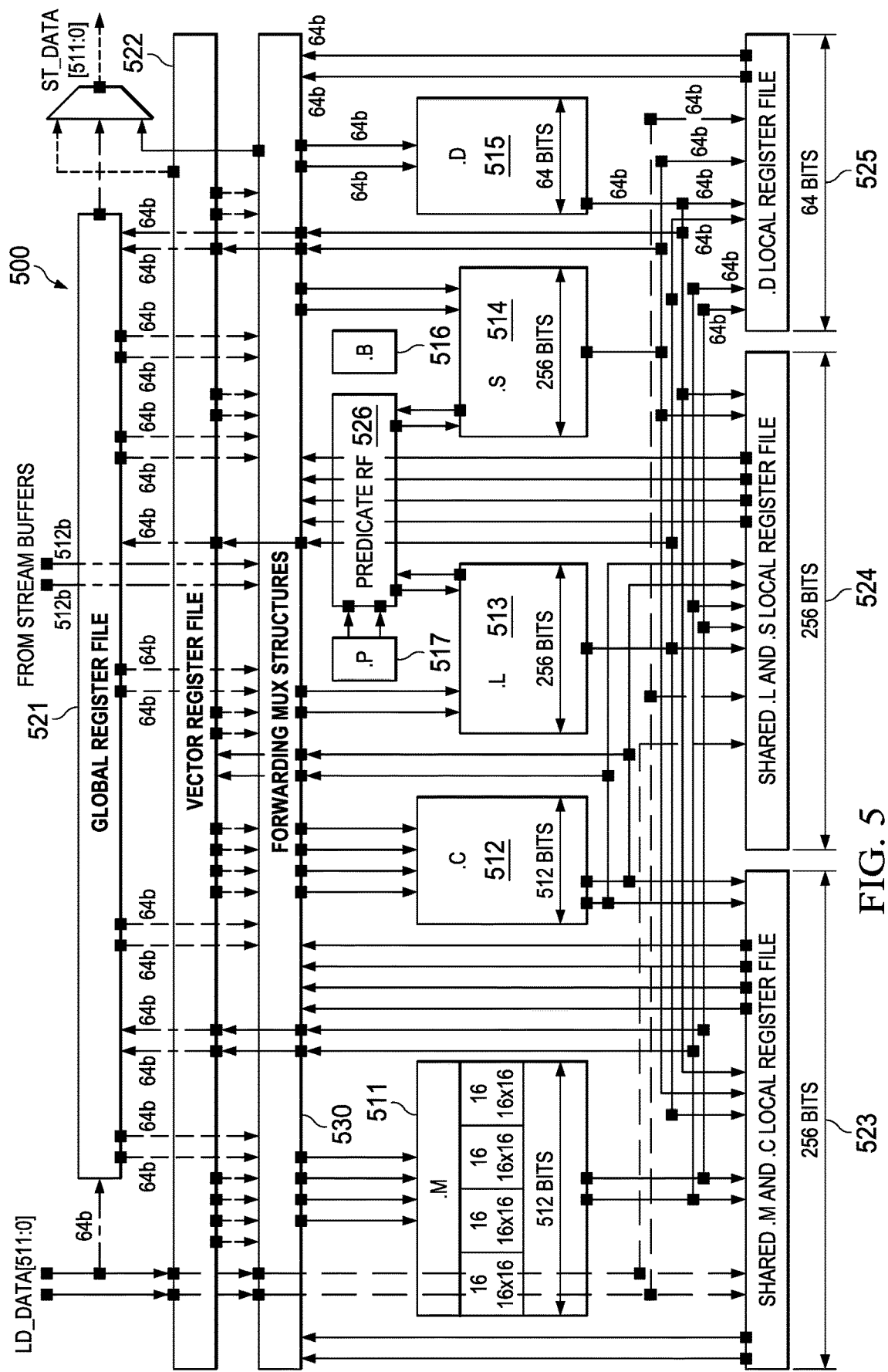
FIG. 5 illustrates construction of one embodiment of the CPU of this invention.

Vector CPUs 310, 410 and 420 further differ from the corresponding scalar CPUs 110, 210 and 220 in the inclusion of streaming engine 313 (FIG. 3) and streaming engines 413 and 423 (FIG. 5). Streaming engines 313, 413 and 423 are similar. Streaming engine 313 transfers data from level two unified cache 313 (L2) to a vector CPU 310. Streaming engine 413 transfers data from level two unified cache 431 to vector CPU 410. Streaming engine 423 transfers data from level two unified cache 431 to vector CPU 420. In accordance with the preferred embodiment each streaming engine 313, 413 and 423 manages up to two data streams.

Each streaming engine 313, 413 and 423 transfer data in certain restricted circumstances. A stream consists of a sequence of elements of a particular type. Programs that operate on streams read the data sequentially, operating on each element in turn. Every stream has the following basic properties. The stream data have a well-defined beginning and ending in time. The stream data have fixed element size and type throughout the stream. The stream data have fixed sequence of elements. Thus programs cannot seek randomly within the stream. The stream data is read-only while active. Programs cannot write to a stream while simultaneously reading from it. Once a stream is opened, the streaming engine: calculates the address; fetches the defined data type from level two unified cache; performs data type manipulation such as zero extension, sign extension, data element sorting/swapping such as matrix transposition; and delivers the data directly to the programmed execution unit within the CPU. Streaming engines are thus useful for real-time digital filtering operations on well-behaved data. Streaming engines free these memory fetch tasks from the corresponding CPU enabling other processing functions.

The streaming engines provide the following benefits. They permit multi-dimensional memory accesses. They increase the available bandwidth to the functional units. They minimize the number of cache miss stalls since the stream buffer can bypass L1D cache. They reduce the number of scalar operations required in the loop to maintain. They manage the address pointers. They handle address generation automatically freeing up the address generation instruction slots and the .D unit for other computations.

FIG. 5 illustrates construction of one embodiment of the CPU of this invention. Except where noted this description covers both scalar CPUs and vector CPUs. The CPU of this invention includes plural execution units multiply unit 511 (.M), correlation unit 512 (.C), arithmetic unit 513 (.L), arithmetic unit 514 (.S), load/store unit 515 (.D), branch unit 516 (.B) and predication unit 517 (.P). The operation and relationships of these execution units are detailed below.

Multiply unit 511 primarily preforms multiplications. Multiply unit 511 accepts up to two double vector operands and produces up to one double vector result. Multiply unit 511 is instruction configurable to perform the following operations: various integer multiply operations, with precision ranging from 8-bits to 64-bits; various regular and complex dot product operations; various floating point multiply operations; bit-wise logical operations, moves, as well as adds and subtracts. As illustrated in FIG. 5 multiply unit 511 includes hardware for four simultaneous 16 bit by 16 bit multiplications. Multiply unit 511 may access global scalar register file 521, global vector register file 522 and shared .M and .C local register 523 file in a manner described below. Forwarding multiplexer 530 mediates the data transfer between global scalar register file 521, global vector register file 522, the corresponding streaming engine, and multiply unit 511.

Correlation unit 512 (.C) accepts up to two double vector operands and produces up to one double vector result. Correlation unit 512 supports these major operations. In support of WCDMA "Rake" and "Search" instructions correlation unit 512 performs up to 512 2-bit PN*8-bit I/Q complex multiplies per clock cycle. Correlation unit 512 performs 8-bit and 16-bit Sum-of-Absolute-Difference (SAD) calculations performing up to 512 SADs per clock cycle. Correlation unit 512 performs horizontal add and horizontal min/max instructions. Correlation unit 512 performs vector permutes instructions. Correlation unit 512 includes 8 256-bit wide control registers. These control registers are used to control the operations of certain correlation unit instructions. Correlation unit 512 may access global scalar register file 521, global vector register file 522 and shared .M and .C local register file 523 in a manner described below. Forwarding multiplexer 530 mediates the data transfer between global scalar register file 521, global vector register file 522, the corresponding streaming engine and correlation unit 512.

CPU 500 includes two arithmetic units: arithmetic unit 513 (.L) and arithmetic unit 514 (.S). Each arithmetic unit 513 and arithmetic unit 514 accepts up to two vector operands and produces one vector result. The compute units support these major operations. Arithmetic unit 513 and arithmetic unit 514 perform various single-instruction-multiple-data (SIMD) fixed point arithmetic operations with precision ranging from 8-bit to 64-bits. Arithmetic unit 513 and arithmetic unit 514 perform various vector compare and minimum/maximum instructions which write results directly to predicate register file 526 (further described below). These comparisons include A=B, A>B, A≥B, A<B and A≤B. If the comparison is correct, a 1 is stored in the corresponding bit position within the predicate register. If the comparison fails, a 0 is stored in the corresponding bit position within the predicate register. Vector compare instructions assume byte (8 bit) data and thus generate 32 single bit results. Arithmetic unit 513 and arithmetic unit 514 perform various vector operations using a designated predicate register as explained below. Arithmetic unit 513 and arithmetic unit 514 perform various SIMD floating point arithmetic operations with precision ranging from half-precision (16-bits), single precision (32-bits) to double precision (64-bits). Arithmetic unit 513 and arithmetic unit 514 perform specialized instructions to speed up various algorithms and functions. Arithmetic unit 513 and arithmetic unit 514 may access global scalar register file 521, global vector register file 522, shared .L and .S local register file 524 and predicate register file 526. Forwarding multiplexer 530 mediates the data transfer between global scalar register file 521, global vector register file 522, the corresponding streaming engine and arithmetic units 513 and 514.

Load/store unit 515 (.D) is primarily used for address calculations. Load/store unit 515 is expanded to accept scalar operands up to 64-bits and produces scalar result up to 64-bits. Load/store unit 515 includes additional hardware to perform data manipulations such as swapping, pack and unpack on the load and store data to reduce workloads on the other units. Load/store unit 515 can send out one load or store request each clock cycle along with the 44-bit physical address to level one data cache (L1D). Load or store data width can be 32-bits, 64-bits, 256-bits or 512-bits. Load/store unit 515 supports these major operations: 64-bit SIMD arithmetic operations; 64-bit bit-wise logical operations; and scalar and vector load and store data manipulations. Load/store unit 515 preferably includes a micro-TLB (table look-aside buffer) block to perform address translation from a 48-bit virtual address to a 44-bit physical address. Load/store unit 515 may access global scalar register file 521, global vector register file 522 and .D local register file 525 in a manner described below. Forwarding multiplexer 530 mediates the data transfer between global scalar register file 521, global vector register file 522, the corresponding streaming engine and load/store unit 515.

Branch unit 516 (.B) calculates branch addresses, performs branch predictions, and alters control flows dependent on the outcome of the prediction.

Predication unit 517 (.P) is a small control unit which performs basic operations on vector predication registers. Predication unit 517 has direct access to the vector predication registers 526. Predication unit 517 performs different bit operations on the predication registers such as AND, ANDN, OR, XOR, NOR, BITR, NEG, SET, BITCNT (bit count), RMBD (right most bit detect), BIT Decimate and Expand, etc.

Figure 6:
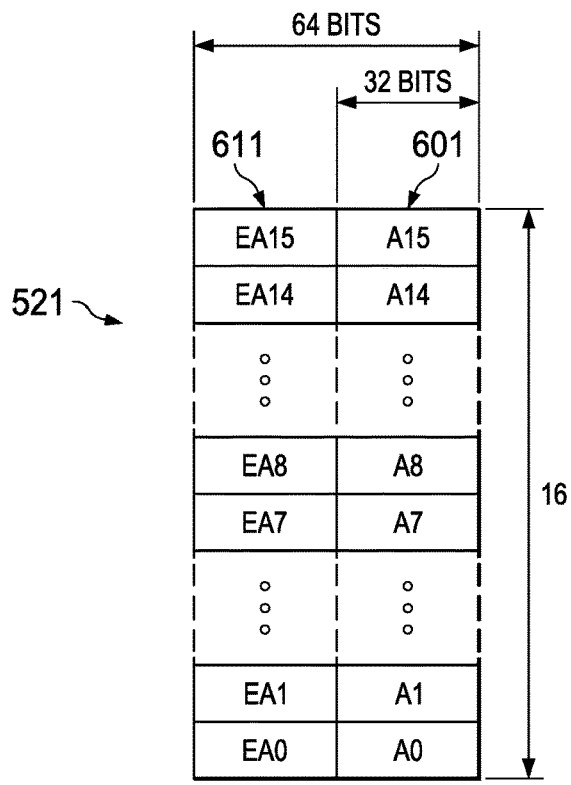
FIG. 6 illustrates a global scalar register file.

FIG. 6 illustrates global scalar register file 521. There are 16 independent 64-bit wide scalar registers. Each register of global scalar register file 521 can be read as 32-bits scalar data (designated registers A0 to A15 601) or 64-bits of scalar data (designated registers EA0 to EA15 611). However, writes are always 64-bit, zero-extended to fill up to 64-bits if needed. All scalar instructions of all functional units can read or write to global scalar register file 521. The instruction type determines the data size. Global scalar register file 521 supports data types ranging in size from 8-bits through 64-bits. A vector instruction can also write to the 64-bit global scalar registers 521 with the upper 192 bit data of the vector discarded. A vector instruction can also read 64-bit data from the global scalar register file 511. In this case the operand is zero-extended in the upper 192-bit to form an input vector.

Figure 7:
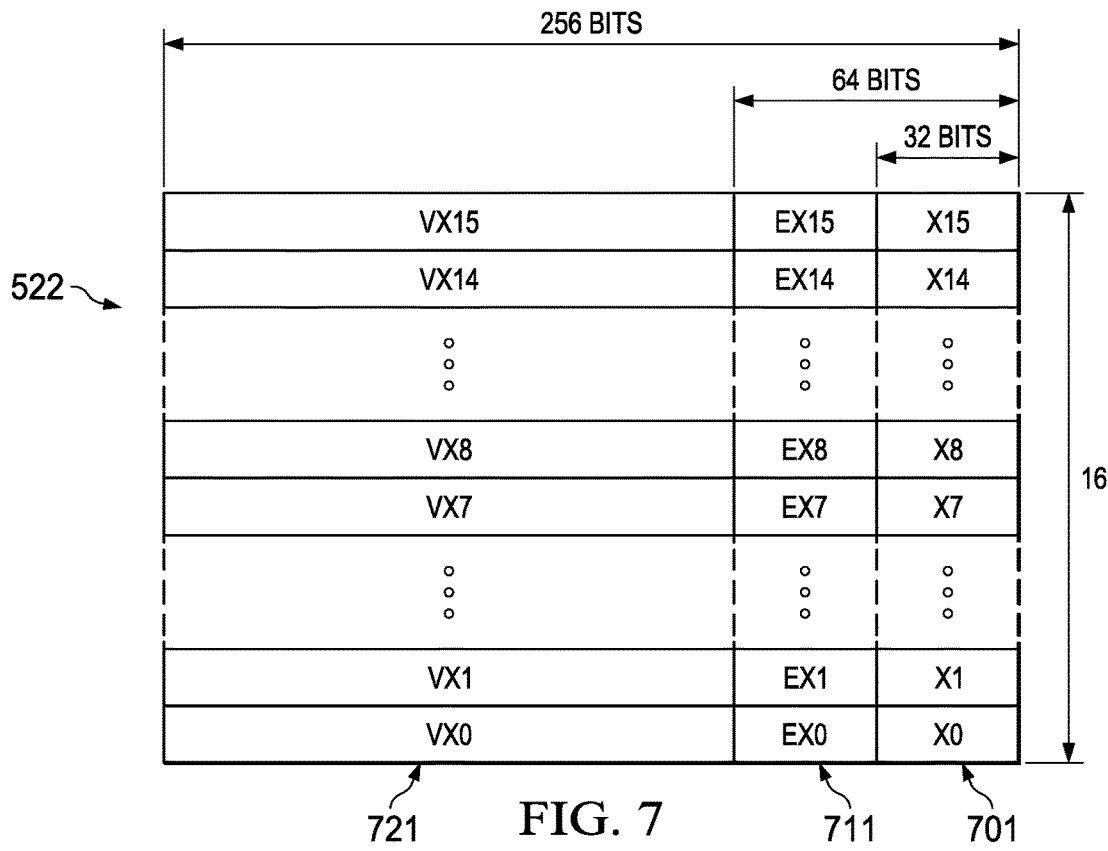
FIG. 7 illustrates a global vector register file.

FIG. 7 illustrates global vector register file 522. There are 16 independent 256-bit wide vector registers. Each register of global vector register file 522 can be read as 32-bits scalar data (designated registers X0 to X15 701), 64-bits of scalar data (designated registers EX0 to EX15 711), 256-bit vector data (designated registers VX0 to VX15 721) or 512-bit double vector data (designated DVX0 to DVX7, not illustrated). In the current embodiment only multiply unit 511 and correlation unit 512 may execute double vector instructions. All vector instructions of all functional units can read or write to global vector register file 522. Any scalar instruction of any functional unit can also access the low 32 or 64 bits of a global vector register file 522 register for read or write. The instruction type determines the data size.

FIG. 8 illustrates local vector register file 523. There are 16 independent 256-bit wide vector registers. Each register of local vector register file 523 can be read as 32-bits scalar data (designated registers M0 to M15 801), 64-bits of scalar data (designated registers EM0 to EM15 811), 256-bit vector data (designated registers VM0 to VM15 821) or 512-bit double vector data (designated DVM0 to DVM7, not illustrated). In the current embodiment only multiply unit 511 and correlation unit 512 may execute double vector instructions. All vector instructions of all functional units can write to local vector register file 523. Only instructions of multiply unit 511 and correlation unit 512 may read from local vector register file 523. The instruction type determines the data size.

Multiply unit 511 may operate upon double vectors (512-bit data). Multiply unit 511 may read double vector data from and write double vector data to global vector register file 521 and local vector register file 523. Register designations DVXx and DVMx are mapped to global vector register file 521 and local vector register file 523 as follows.

TABLE 1

| Instruction Designation | Register Accessed |
| --- | --- |
| DVX0 | VX1:VX0 |
| DVX1 | VX3:VX2 |
| DVX2 | VX5:VX4 |
| DVX3 | VX7:VX6 |
| DVX4 | VX9:VX8 |
| DVX5 | VX11:VX10 |
| DVX6 | VX13:VX12 |
| DVX7 | VX15:VX14 |
| DVM0 | VM1:VM0 |
| DVM1 | VM3:VM2 |
| DVM2 | VM5:VM4 |
| DVM3 | VM7:VM6 |
| DVM4 | VM9:VM8 |
| DVM5 | VM11:VM10 |
| DVM6 | VM13:VM12 |
| DVM7 | VM15:VM14 |

Each double vector designation maps to a corresponding pair of adjacent vector registers in either global vector register 522 or local vector register 523. Designations DVX0 to DVX7 map to global vector register 522. Designations DVM0 to DVM7 map to local vector register 523.

Local vector register file 524 is similar to local vector register file 523. There are 16 independent 256-bit wide vector registers. Each register of local vector register file 524 can be read as 32-bits scalar data (designated registers L0 to L15), 64-bits of scalar data (designated registers EL0 to EL15) or 256-bit vector data (designated registers VL0 to VL15). All vector instructions of all functional units can write to local vector register file 524. Only instructions of arithmetic unit 513 and arithmetic unit 514 may read from local vector register file 524.

FIG. 9 illustrates local register file 525. There are 16 independent 64-bit wide registers. Each register of local register file 525 can be read as 32-bits scalar data (designated registers D0 to D15 901) or 64-bits of scalar data (designated registers ED0 to ED15 911). All scalar and vector instructions of all functional units can write to local register file 525. Only instructions of load/store unit 515 may read from local register file 525. Any vector instructions can also write 64-bit data to local register file 525 with the upper 192 bit data of the result vector discarded. Any vector instructions can also read 64-bit data from the 64-bit local register file 525 registers. The return data is zero-extended in the upper 192-bit to form an input vector. The registers of local register file 525 can only be used as addresses in load/store instructions, not as store data or as sources for 64-bit arithmetic and logical instructions of load/store unit 515.

FIG. 10 illustrates the predicate register file 517. There are sixteen registers 32-bit registers in predicate register file 517. Predicate register file 517 contains the results from vector comparison operations executed by either arithmetic and is used by vector selection instructions and vector predicated store instructions. A small subset of special instructions can also read directly from predicate registers, performs operations and write back to a predicate register directly. There are also instructions which can transfer values between the global register files (521 and 522) and predicate register file 517. Transfers between predicate register file 517 and local register files (523, 524 and 525) are not supported. Each bit of a predication register (designated P0 to P15) controls a byte of a vector data. Since a vector is 256-bits, the width of a predicate register equals 256/8=32 bits. The predicate register file can be written to by vector comparison operations to store the results of the vector compares.

A CPU such as CPU 110, 210, 220, 310, 410 or 420 operates on an instruction pipeline. This instruction pipeline can dispatch up to nine parallel 32-bits slots to provide instructions to the seven execution units (multiply unit 511, correlation unit 512, arithmetic unit 513, arithmetic unit 514, load/store unit 515, branch unit 516 and predication unit 517) every cycle. Instructions are fetched as instruction packets of fixed length further described below. All instructions require the same number of pipeline phases for fetch and decode, but require a varying number of execute phases.

Figure 11:
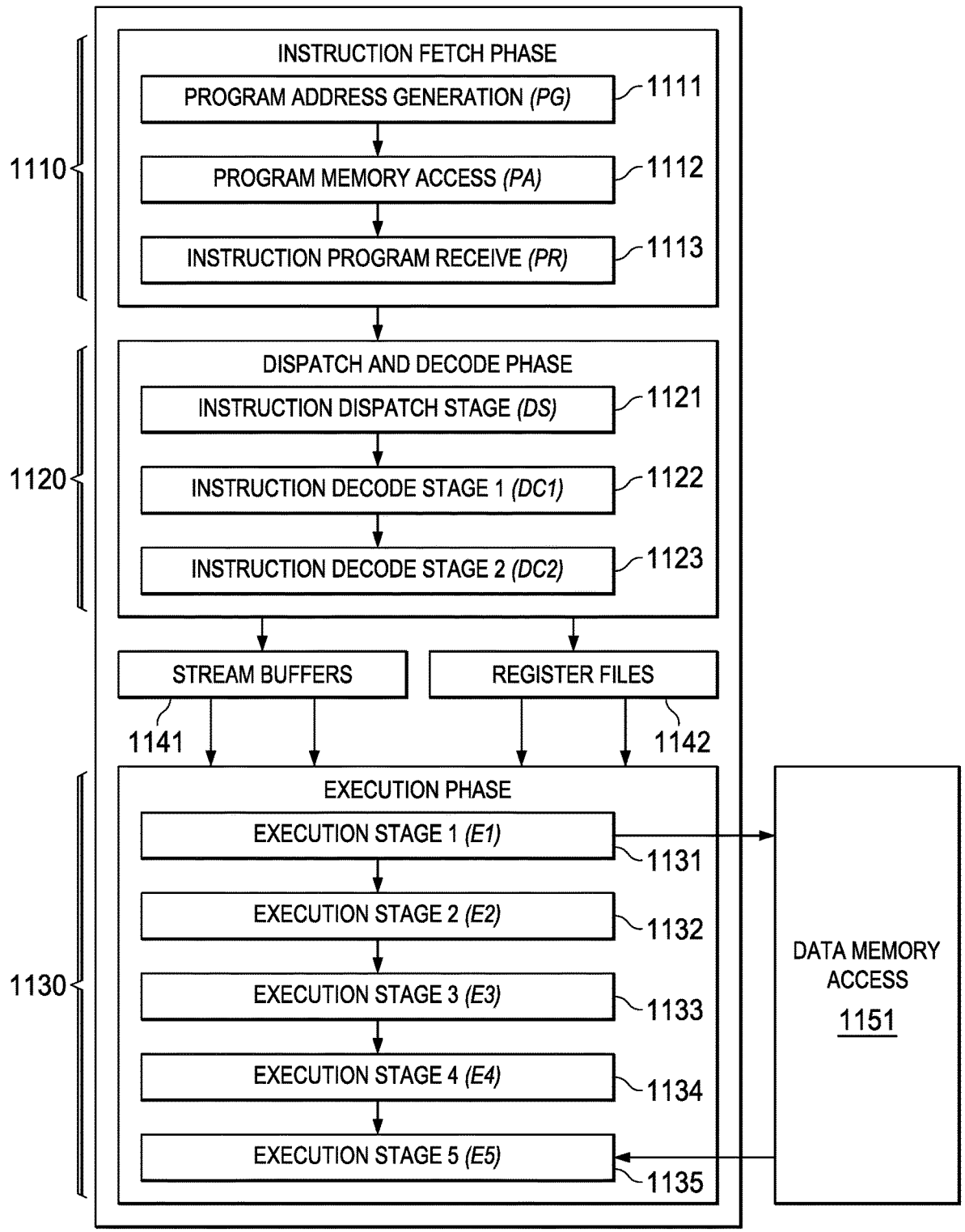
FIG. 11 illustrates pipeline phases of a central processing unit according to a preferred embodiment of this invention.

FIG. 11 illustrates the following pipeline phases: program fetch phase 1110, dispatch and decode phases 1120 and execution phases 1130. Program fetch phase 1110 includes three stages for all instructions. Dispatch and decode phases 1120 include three stages for all instructions. Execution phase 1130 includes one to four stages dependent on the instruction.

Fetch phase 1110 includes program address generation stage 1111 (PG), program access stage 1112 (PA) and program receive stage 1113 (PR). During program address generation stage 1111 (PG), the program address is generated in the CPU and the read request is sent to the memory controller for the level one instruction cache L1I. During the program access stage 1112 (PA) the level one instruction cache L1I processes the request, accesses the data in its memory and sends a fetch packet to the CPU boundary. During the program receive stage 1113 (PR) the CPU registers the fetch packet.

Instructions are always fetched sixteen words at a time. FIG. 12 illustrates this fetch packet. FIG. 12 illustrates 16 instructions 1201 to 1216 of a single fetch packet. Fetch packets are aligned on 512-bit (16-word) boundaries. The execution of the individual instructions is partially controlled by a p bit in each instruction. This p bit is preferably bit 0 of the instruction. The p bit determines whether the instruction executes in parallel with another instruction. The p bits are scanned from lower to higher address. If the p bit of an instruction is 1, then the next following instruction is executed in parallel with (in the same cycle as) that instruction I. If the p bit of an instruction is 0, then the next following instruction is executed in the cycle after the instruction. All instructions executing in parallel constitute an execute packet. An execute packet can contain up to nine instructions. Each instruction in an execute packet must use a different functional unit. An execute packet can contain up to nine 32-bit wide slots. A slot can either be a self-contained instruction or expand the constant field specified by the immediate preceding instruction. A slot can be used as conditional codes to apply to the instructions within the same fetch packet. A fetch packet can contain up to 2 constant extension slots and one condition code extension slot.

There are up to 11 distinct instruction slots, but scheduling restrictions limit to 9 the maximum number of parallel slots. The maximum nine slots are shared as follows: multiply unit 511; correlation unit 512; arithmetic unit 513; arithmetic unit 514; load/store unit 515; branch unit 516 shared with predicate unit 517; a first constant extension; a second constant extension; and a unit-less instruction shared with a condition code extension. The last instruction in an execute packet has a p bit equal to 0.

The CPU and level one instruction cache L1I pipelines are de-coupled from each other. Fetch packet returns from level one instruction cache L1I can take different number of clock cycles, depending on external circumstances such as whether there is a hit in level one instruction cache L1I. Therefore program access stage 1112 (PA) can take several clock cycles instead of 1 clock cycle as in the other stages.

Dispatch and decode phases 1120 include instruction dispatch to appropriate execution unit stage 1121 (DS), instruction pre-decode stage 1122 (DC1); and instruction decode, operand reads stage 1123 (DC2). During instruction dispatch to appropriate execution unit stage 1121 (DS), the fetch packets are split into execute packets and assigned to the appropriate functional units. During the instruction pre-decode stage 1122 (DC1) the source registers, destination registers, and associated paths are decoded for the execution of the instructions in the functional units. During the instruction decode, operand reads stage 1123 (DC2) more detailed unit decodes are done, as well as reading operands from the register files.

Execution phases 1130 includes execution stages 1131 to 1135 (E1 to E5). Different types of instructions require different numbers of these stages to complete their execution. These stages of the pipeline play an important role in understanding the device state at CPU cycle boundaries.

During execute 1 stage 1131 (E1) the conditions for the instructions are evaluated and operands are operated on. As illustrated in FIG. 11, execute 1 stage 1131 may receive operands from a stream buffer 1141 and one of the register files shown schematically as 1142. For load and store instructions, address generation is performed and address modifications are written to a register file. For branch instructions, branch fetch packet in PG phase is affected. As illustrated in FIG. 11, load and store instructions access memory here shown schematically as memory 1151. For single-cycle instructions, results are written to a destination register file. This assumes that any conditions for the instructions are evaluated as true. If a condition is evaluated as false, the instruction does not write any results or have any pipeline operation after execute 1 stage 1131.

During execute 2 stage 1132 (E2) load instructions send the address to memory. Store instructions send the address and data to memory. Single-cycle instructions that saturate results set the SAT bit in the control status register (CSR) if saturation occurs. For 2-cycle instructions, results are written to a destination register file.

During execute 3 stage 1133 (E3) data memory accesses are performed. Any multiply instructions that saturate results set the SAT bit in the control status register (CSR) if saturation occurs. For 3-cycle instructions, results are written to a destination register file.

During execute 4 stage 1134 (E4) load instructions bring data to the CPU boundary. For 4-cycle instructions, results are written to a destination register file.

During execute 5 stage 1135 (E5) load instructions write data into a register. This is illustrated schematically in FIG. 11 with input from memory 1151 to execute 5 stage 1135.

FIG. 13 illustrates an example of the instruction coding of instructions used by this invention. Each instruction consists of 32 bits and controls the operation of one of the individually controllable functional units (multiply unit 511, correlation unit 512, arithmetic unit 513, arithmetic unit 514, load/store unit 515). The bit fields are defined as follows. The creg field and the z bit are optional fields used in conditional instructions. These bits are used for conditional instructions to identify the predicate register and the condition. The z bit (bit 28) indicates whether the predication is based upon zero or not zero in the predicate register. If z=1, the test is for equality with zero. If z=0, the test is for nonzero. The case of creg=0 and z=0 is treated as always true to allow unconditional instruction execution. The creg field and the z field are encoded in the instruction as shown in Table 2.

TABLE 2

| Conditional | creg | | | z |
|---|---|---|---|---|
| Register | 31 | 30 | 29 | 28 |
| Unconditional | 0 | 0 | 0 | 0 |
| Reserved | 0 | 0 | 0 | 1 |
| A0 | 0 | 0 | 1 | z |
| A1 | 0 | 1 | 0 | z |
| A2 | 0 | 1 | 1 | z |
| A3 | 1 | 0 | 0 | z |
| A4 | 1 | 0 | 1 | z |
| A5 | 1 | 1 | 0 | z |
| Reserved | 1 | 1 | x | x |

Note that "z" in the z bit column refers to the zero/not zero comparison selection noted above and "x" is a don't care state. This coding can only specify a subset of the 16 global scalar registers as predicate registers. This selection was made to preserve bits in the instruction coding. Note that unconditional instructions do not have these optional bits. For unconditional instructions these bits (28 to 31) are preferably used as additional opcode bits. However, if needed, an execute packet can contain a unique 32-bit condition code extension slot which contains the 4-bit CREGZ fields for the instructions which are in the same execute packet. Table 3 shows the coding of such a condition code extension slot.

TABLE 3

| Bits | Functional Unit |
|---|---|
| 3:0 | .L |
| 7:4 | .S |
| 11:5 | .D |
| 15:12 | .M |
| 19:16 | .C |
| 23:20 | .B |
| 28:24 | Reserved |
| 31:29 | Reserved |

Thus the condition code extension slot specifies bits decoded in the same way the creg/z bits assigned to a particular functional unit in the same execute packet.

Special vector predicate instructions use the designated predicate register to control vector operations. In the current embodiment all these vector predicate instructions operate on byte (8 bit) data. Each bit of the predicate register controls whether a SIMD operation is performed upon the corresponding byte of data. The operations of predicate unit 517 permit a variety of compound vector SIMD operations based upon more than one vector comparison. For example a range determination can be made using two comparisons. A candidate vector is compared with a first vector reference having the minimum of the range packed within a first data register. A second comparison of the candidate vector is made with a second reference vector having the maximum of the range packed within a second data register. Logical combinations of the two resulting predicate registers would permit a vector conditional operation to determine whether each data part of the candidate vector is within range or out of range.

The dst field specifies a register in a corresponding register file as the destination of the instruction results.

The src2 field specifies a register in a corresponding register file as the second source operand.

The src1/cst field has several meanings depending on the instruction opcode field (bits 1 to 12 and additionally bits 28 to 31 for unconditional instructions). The first meaning specifies a register of a corresponding register file as the first operand. The second meaning is an immediate constant. Depending on the instruction type, this is treated as an unsigned integer and zero extended to a specified data length or is treated as a signed integer and sign extended to the specified data length.

The opcode field (bits 1 to 12 for all instructions and additionally bits 28 to 31 for unconditional instructions) specifies the type of instruction and designates appropriate instruction options. This includes designation of the functional unit and operation performed. A detailed explanation of the opcode is beyond the scope of this invention except for the instruction options detailed below.

The p bit (bit 0) marks the execute packets. The p-bit determines whether the instruction executes in parallel with the following instruction. The p-bits are scanned from lower to higher address. If p=1 for the current instruction, then the next instruction executes in parallel with the current instruction. If p=0 for the current instruction, then the next instruction executes in the cycle after the current instruction. All instructions executing in parallel constitute an execute packet. An execute packet can contain up to eight instructions. Each instruction in an execute packet must use a different functional unit.

Correlation unit 512 and arithmetic units 513 and 514 often operate in a single instruction multiple data (SIMD) mode. In this SIMD mode the same instruction is applied to packed data from the two operands. Each operand holds plural data elements disposed in predetermined slots. SIMD operation is enabled by carry control at the data boundaries. Such carry control enables operations on varying data widths.

FIG. 14 illustrates the carry control. AND gate 1401 receives the carry output of bit N within the operand wide arithmetic logic unit (256 bits for arithmetic units 513 and 514, 512 bits for correlation unit 512). AND gate 1401 also receives a carry control signal which will be further explained below. The output of AND gate 1401 is supplied to the carry input of bit N+1 of the operand wide arithmetic logic unit. AND gates such as AND gate 1401 are disposed between every pair of bits at a possible data boundary. For example, for 8-bit data such an AND gate will be between bits 7 and 8, bits 15 and 16, bits 23 and 24, etc. Each such AND gate receives a corresponding carry control signal. If the data size is of the minimum, then each carry control signal is 0, effectively blocking carry transmission between the adjacent bits. The corresponding carry control signal is 1 if the selected data size requires both arithmetic logic unit sections. Table 4 below shows example carry control signals for the case of a 256 bit wide operand such as used in arithmetic units 513 and 514 which may be divided into sections of 8 bits, 16 bits, 32 bits, 64 bits or 128 bits. No control of the carry output of the most significant bit is needed, thus only 31 carry control signals are required.

TABLE 4

| Data Size | Carry Control Signals | | | | | | | |
|---|---|---|---|---|---|---|---|---|
| 8 bits | -000 | 0000 | 0000 | 0000 | 0000 | 0000 | 0000 | 0000 |
| 16 bits | -101 | 0101 | 0101 | 0101 | 0101 | 0101 | 0101 | 0101 |
| 32 bits | -111 | 0111 | 0111 | 0111 | 0111 | 0111 | 0111 | 0111 |
| 64 bits | -111 | 1111 | 0111 | 1111 | 0111 | 1111 | 0111 | 1111 |
| 128 bits | -111 | 1111 | 1111 | 1111 | 0111 | 1111 | 1111 | 1111 |
| 256 bits | -111 | 1111 | 1111 | 1111 | 1111 | 1111 | 1111 | 1111 |

It is typical in the art to operate on data sizes that are integral powers of 2 ($2^N$). However, this carry control technique is not limited to integral powers of 2. One skilled in the art would understand how to apply this technique to other data sizes and other operand widths.

This invention addresses the above noted challenges by integrating a range of interesting technologies into a single block. This combination directly attacks the interlinked issues raised above. Each DSP CPU has a streaming engine and vector support. Each DSP CPU includes efficient vector compute; scoreboarded loads, speculative loads and software directed prefetch. The streaming engines include: a SE to L2 interface that can request 512 bits/cycle from L2; a loose binding between SE and L2 interface, to allow a single stream to peak at 1024 bits/cycle; one-way coherence where the SE sees all earlier writes cached in system, but not writes that occur after stream opens; full protection against single-bit data errors within its internal storage via single-bit parity with semi-automatic restart on parity error; a full modified, exclusive, shared, invalid (MESI) coherence to maintain coherence with L2 RAM, external shared MSMC RAM and data cached in L2 cache from other places in system. This invention employs a credit based bidirectional bus protocol used both internally and for external interface. This Credit system ensures blocking requests such as allocations and victims cannot interfere with non-blocking requests such as snoop responses.

Multiple CPUs in the same block make better use of all wires leading to that block. For systems that have a high compute to bandwidth ratio, it makes sense to integrate more cores in each System On Chip (SOC). In other systems a different tradeoff might be better. By allowing a mix of vector and scalar processors, a system architect can cater to the exact mix of control, compute and bandwidth requirements of a system.

Scoreboarded loads, speculative loads and software prefetches all allow the processor to get more read requests and therefore cache misses in flight, hiding more memory system latency and improving bus utilization.

Streaming engines allow aggressively prefetching data ahead of the CPU bypassing the L1D cache. Four streaming engines can sustain reading 2048 bits/cycle to L2 RAM/cache. A single streaming engine can use the maximum bandwidth of the MSMC RAM interface. Two streaming engines should be able use the maximum bandwidth of a single DDR3 interface.

The memory management unit (MMU) makes it easier to integrate the DSP of this invention with a general purpose OS. Converting the caches to PIPT with full MESI support means that they can cooperate with other processors in a hardware managed coherence protocol as well.

A credit-based protocol makes it possible to multiplex multiple independent traffic streams (demand fetch, snoop traffic, SDMA) over the same busses getting maximal reuse out of the same wires. This enables better utilization of the wires, allowing performance to improve noticeably without adding to the wiring bottleneck. Accounting for the redundant metadata between the SDMA and MDMA busses, the new, combined bus has about the same number of wires but offers nearly double the total theoretical peak throughput. Including other protocol improvements, the actual improvement should be larger due to greater utilization.

To cope with the greater tasking demand retain real-time operation, this invention incorporates features such as threaded table walks and the ability to abort a table walk on interrupt to support multitasking.

Pervasive parity and single error correction, double error detection (SECDED) support dramatically reduces the device's Failure-in-Time Rate (FIT rate) by protecting nearly all memories and a large number of pipeline registers.

This particular combination of components provides a lot of synergy. For instance, the credit-based protocol gets more data transfers out of the same number of wires. This improves area efficiency greatly. More straightforward solutions lack this property, relying more heavily on dedicated busses when needed.

This invention's emphasis on good control performance, standardized MMU and hardware coherence makes it easier to bring apps to the DSP as well as integrate the DSP with the rest of the system. While the MMU and hardware coherence are fairly standard, the in-order DSP's control performance of this invention may exceed in-order CPU performance of general purpose microprocessors due to better overall instruction set and better system integration.

The decoupled pipeline of this invention offered by the scoreboard allows the CPU to leverage the memory system more effectively. Speculative loads and software directed prefetch also aid this.

The streaming engines of this invention make it possible to scale our performance up, despite the challenges provided by the interconnect.

A stream consists of a sequence of elements of a particular type. Programs that operate on streams read the data sequentially, operating on each element in turn. Every stream has the following basic properties: a well-defined lifetime including a beginning and ending in time; a fixed element size and type throughout the entire stream; a fixed sequence of elements, no random seeking within the stream; streams are read-only while active.

Programs start streams by opening them and end streams by closing them. Streams may self-close if the program reads all of the stream's elements. This gives the stream a well-defined lifetime, with distinct periods before, during, and after the stream. The before period includes all memory accesses issued before the program opens the stream. Streams can see all updates to memory that happened before the stream opens. The during period fills the space between before and after. It starts when the program opens the stream and ends when the program closes the stream or when the stream reads the last element, whichever comes first. The after period begins once the stream ends. No further accesses to the stream can happen after the stream closes.

Streams are read-only while active. This property highlights the importance of the clear before, during and after periods with respect to a stream. Defining streams as read-only while active oversimplifies the situation. Streams guarantee the following: streams see all writes that happen before a stream; streams see no writes that happen after a stream; streams see an indeterminate subset of writes that happen during a stream. Streams provide very clear semantics for writes that occur before and after streams. The programmer provides deterministic behavior by not overwriting data in active streams.

All elements in a given stream have the same size and type. The elements of the stream pack in a regular structure in memory. All the elements of a stream are the same: signed integer; unsigned integer; floating point; real; complex. Real number elements include a single value. Complex numbers are a pair of sub-elements each having a single value. A sequence of elements, each containing a pair of sub-elements of some integer or floating point type. The term element refers to the minimum granule of fetch for a stream and sub-element refers to each scalar numeric value in the stream. A sub-element may be half of a complex number or may stand on its own. These attributes apply to all elements of a stream, making the stream definition compact and rigid.

Because the elements in the stream all share the same type, the stream definition may compactly specify transformations to apply to all stream elements. Typical transformations include type promotion and exchanging the sub-elements of complex numbers. The stream parameters define a fixed order of elements in memory. The stream parameters entirely determine the stream layout. No data in the stream, such as linked list pointers, may modify its layout. This property allows the stream buffer to read quite far ahead of the DSP CPU's need for the data. It also allows the stream buffer to discard data as soon as it supplies the data to the DSP CPU.

Figure 15:
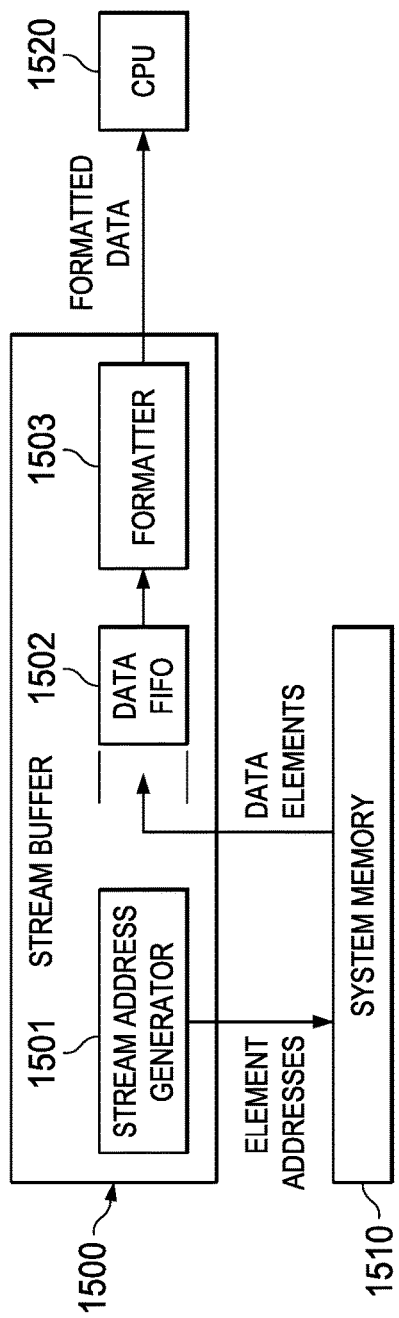
FIG. 15 illustrates a conceptual view of the stream engines of this invention.

FIG. 15 illustrates a conceptual view of the stream engines of this invention such as streaming engines 313, 413 and 423. FIG. 15 illustrates the process of a single stream. Streaming engine 1500 includes stream address generator 1501. Stream address generator 1501 sequentially generates addresses of the elements of the stream and supplies these element addresses to system memory 1510.

Memory 1510 recalls data stored at the element addresses (data elements) and supplies these data elements to data first-in-first-out (FIFO) memory 1502. Data FIFO 1502 provides buffering between memory 1510 and CPU 1520. Data formatter 1503 receives the data elements from data FIFO memory 1502 and provides data formatting according to the stream definition. This process will be described below. Stream engine 1500 supplies the formatted data elements from data formatter 1503 to the CPU 1520. The program on CPU 1520 consumes the data and generates an output.

Stream elements typically reside in normal memory. The memory itself imposes no particular structure upon the stream. Programs define streams and therefore impose structure, by specifying the following stream attributes: address of the first element of the stream; size and type of the elements in the stream; formatting for data in the stream; and the address sequence associated with the stream.

The streaming engine defines an address sequence for elements of the stream in terms of a pointer walking through memory. A multiple-level loop nest controls the path the pointer takes. An iteration count for a loop level indicates the number of times that level repeats. A dimension gives the distance between pointer positions of that loop level.

In a basic forward stream the innermost loop always consumes physically contiguous elements from memory. The implicit dimension of this innermost loop is 1 element. The pointer itself moves from element to element in consecutive, increasing order. In each level outside the inner loop, that loop moves the pointer to a new location based on the size of that loop level's dimension.

This form of addressing allows programs to specify regular paths through memory in a small number of parameters. Table 5 lists the addressing parameters of a basic stream.

TABLE 5

| Parameter | Definition |
| --- | --- |
| ELEM_BYTES | Size of each element in bytes |
| ICNT0 | Number of iterations for the innermost loop level 0. At loop level 0 all elements are physically contiguous DIM0 is ELEM_BYTES |
| ICNT1 | Number of iterations for loop level 1 |
| DIM1 | Number of elements between the starting points for consecutive iterations of loop level 1 |
| ICNT2 | Number of iterations for loop level 2 |
| DIM2 | Number of elements between the starting points for consecutive iterations of loop level 2 |
| ICNT3 | Number of iterations for loop level 3 |
| DIM3 | Number of elements between the starting points for consecutive iterations of loop level 3 |

The definition above maps consecutive elements of the stream to increasing addresses in memory. This works well for most algorithms but not all. Some algorithms are better served by reading elements in decreasing memory addresses, reverse stream addressing. For example, a discrete convolution computes vector dot-products, as per the formula:

$$(f,g)[t] = \sum_{x=-\infty}^{\infty} f[x]g[t-x]$$

In most DSP code, f[ ] and g[ ] represent arrays in memory. For each output, the algorithm reads f[ ] in the forward direction, but reads g[ ] in the reverse direction. Practical filters limit the range of indices for [x] and [t-x] to a finite number elements. To support this pattern, the streaming engine supports reading elements in decreasing address order.

Matrix multiplication presents a unique problem to the streaming engine. Each element in the matrix product is a vector dot product between a row from the first matrix and a column from the second. Programs typically store matrices all in row-major or column-major order. Row-major order stores all the elements of a single row contiguously in memory. Column-major order stores all elements of a single column contiguously in memory. Matrices typically get stored in the same order as the default array order for the language. As a result, only one of the two matrices in a matrix multiplication map on to the streaming engine's 2-dimensional stream definition. In a typical example a first index steps through columns on array first array but rows on second array. This problem is not unique to the streaming engine. Matrix multiplication's access pattern fits poorly with most general-purpose memory hierarchies. Some software libraries transposed one of the two matrices, so that both get accessed row-wise (or column-wise) during multiplication. The streaming engine supports implicit matrix transposition with transposed streams. Transposed streams avoid the cost of explicitly transforming the data in memory. Instead of accessing data in strictly consecutive-element order, the streaming engine effectively interchanges the inner two loop dimensions in its traversal order, fetching elements along the second dimension into contiguous vector lanes.

This algorithm works, but is impractical to implement for small element sizes. Some algorithms work on matrix tiles which are multiple columns and rows together. Therefore, the streaming engine defines a separate transposition granularity. The hardware imposes a minimum granularity. The transpose granularity must also be at least as large as the element size. Transposition granularity causes the streaming engine to fetch one or more consecutive elements from dimension 0 before moving along dimension 1. When the granularity equals the element size, this results in fetching a single column from a row-major array. Otherwise, the granularity specifies fetching 2, 4 or more columns at a time from a row-major array. This is also applicable for column-major layout by exchanging row and column in the description. A parameter GRANULE indicates the transposition granularity in bytes.

Another common matrix multiplication technique exchanges the innermost two loops of the matrix multiply. The resulting inner loop no longer reads down the column of one matrix while reading across the row of another. For example the algorithm may hoist one term outside the inner loop, replacing it with the scalar value. On a vector machine, the innermost loop can be implements very efficiently with a single scalar-by-vector multiply followed by a vector add. The DSP CPU of this invention lacks a scalar-by-vector multiply. Programs must instead duplicate the scalar value across the length of the vector and use a vector-by-vector multiply. The streaming engine of this invention directly supports this and related use models with an element duplication mode. In this mode, the streaming engine reads a granule smaller than the full vector size and replicates that granule to fill the next double vector output.

The streaming engine treats each complex number as a single element with two sub-elements that give the real and imaginary (rectangular) or magnitude and angle (polar) portions of the complex number. Not all programs or peripherals agree what order these sub-elements should appear in memory. Therefore, the streaming engine offers the ability to swap the two sub-elements of a complex number with no cost. This feature swaps the halves of an element without interpreting the contents of the element and can be used to swap pairs of sub-elements of any type, not just complex numbers.

Algorithms generally prefer to work at high precision, but high precision values require more storage and bandwidth than lower precision values. Commonly, programs will store data in memory at low precision, promote those values to a higher precision for calculation and then demote the values to lower precision for storage. The streaming engine supports this directly by allowing algorithms to specify one level of type promotion. In the preferred embodiment of this invention every sub-element may be promoted to the next larger type size with either sign or zero extension for integer types. It is also feasible that the streaming engine may support floating point promotion, promoting 16-bit and 32-bit floating point values to 32-bit and 64-bit formats, respectively.

The streaming engine defines a stream as a discrete sequence of elements, the DSP CPU consumes elements packed contiguously in vectors. Vectors resemble streams in as much as they contain multiple homogeneous elements with some implicit sequence. Because the streaming engine reads streams, but the DSP CPU consumes vectors, the streaming engine must map streams onto vectors in a consistent way.

Vectors consist of equal-sized lanes, each lane containing a sub-element. The DSP CPU designates the rightmost lane of the vector as lane 0, regardless of device's current endian mode. Lane numbers increase right-to-left. The actual number of lanes within a vector varies depending on the length of the vector and the data size of the sub-element.

Figure 16:
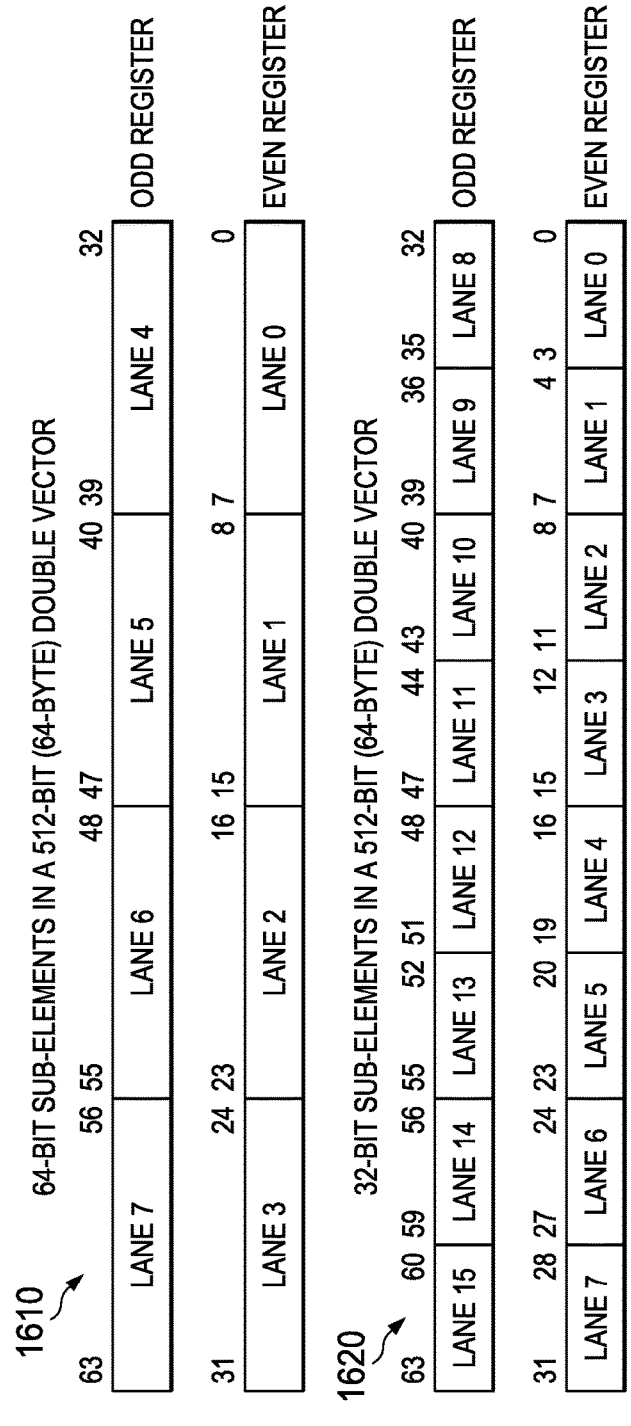
FIG. 16 illustrates two examples of lane allocation in double vectors.

FIG. 16 illustrates two examples of lane allocation in double vectors. Double vector 1610 is divided into 8 64-bit lanes. Lane 0 occupies bytes 0 to 7, line 1 occupied bytes 8 to 15, lane 2 occupies bytes 16 to 23, lane 3 occupies bytes 24 to 31, lane 4 occupies bytes 32 to 39, lane 5 occupies bytes 40 to 47, lane 6 occupies bytes 48 to 55 and lane 7 occupies bytes 56 to 63. Double vector 1620 is divided into 16 32-bit lanes. Lane 0 occupies bytes 0 to 3, line 1 occupied bytes 4 to 7, lane 2 occupies bytes 8 to 11, lane 3 occupies bytes 12 to 15, lane 4 occupies bytes 16 to 19, lane 5 occupies bytes 20 to 23, lane 6 occupies bytes 24 to 27, lane 7 occupies bytes 28 to 31, lane 8 occupies bytes 32 to 35, line 9 occupied bytes 36 to 39, lane 10 occupies bytes 40 to 43, lane 11 occupies bytes 44 to 47, lane 12 occupies bytes 48 to 51, lane 13 occupies bytes 52 to 55, lane 14 occupies bytes 56 to 59 and lane 16 occupies bytes 60 to 63.

The streaming engine maps the innermost stream dimension directly to vector lanes. It maps earlier elements within that dimension to lower lane numbers and later elements to higher lane numbers. This is true regardless of whether this particular stream advanced in increasing or decreasing address order. Whatever order the stream defines, the streaming engine deposits elements in vectors in increasing-lane order. For non-complex data, it places the first element in lane 0 of the first vector the CPU fetches, the second in lane 1, and so on. For complex data, the streaming engine places the first element in lanes 0 and 1, second in lanes 2 and 3, and so on. Sub-elements within an element retain the same relative ordering regardless of the stream direction. For non-swapped complex elements, this places the sub-elements with the lower address of each pair in the even numbered lanes, and the sub-elements with the higher address of each pair in the odd numbered lanes. Swapped complex elements reverse this mapping.

The streaming engine fills each vector the CPU fetches with as many elements as it can from the innermost stream dimension. If the innermost dimension is not a multiple of the vector length, the streaming engine pads that dimension out to a multiple of the vector length with zeros. Thus for higher-dimension streams, the first element from each iteration of an outer dimension arrives in lane 0 of a vector. The streaming engine always maps the innermost dimension to consecutive lanes in a vector. For transposed streams, the innermost dimension consists of groups of sub-elements along dimension 1, not dimension 0, as transposition exchanges these two dimensions.

Two dimensional streams exhibit great variety as compared to one dimensional streams. A basic two dimensional stream extracts a smaller rectangle from a larger rectangle. A transposed 2-D stream reads a rectangle column-wise instead of row-wise. A looping stream, where the second dimension overlaps first executes a finite impulse response (FIR) filter taps which loops repeatedly or FIR filter samples which provide a sliding window of input samples.

Figure 17:
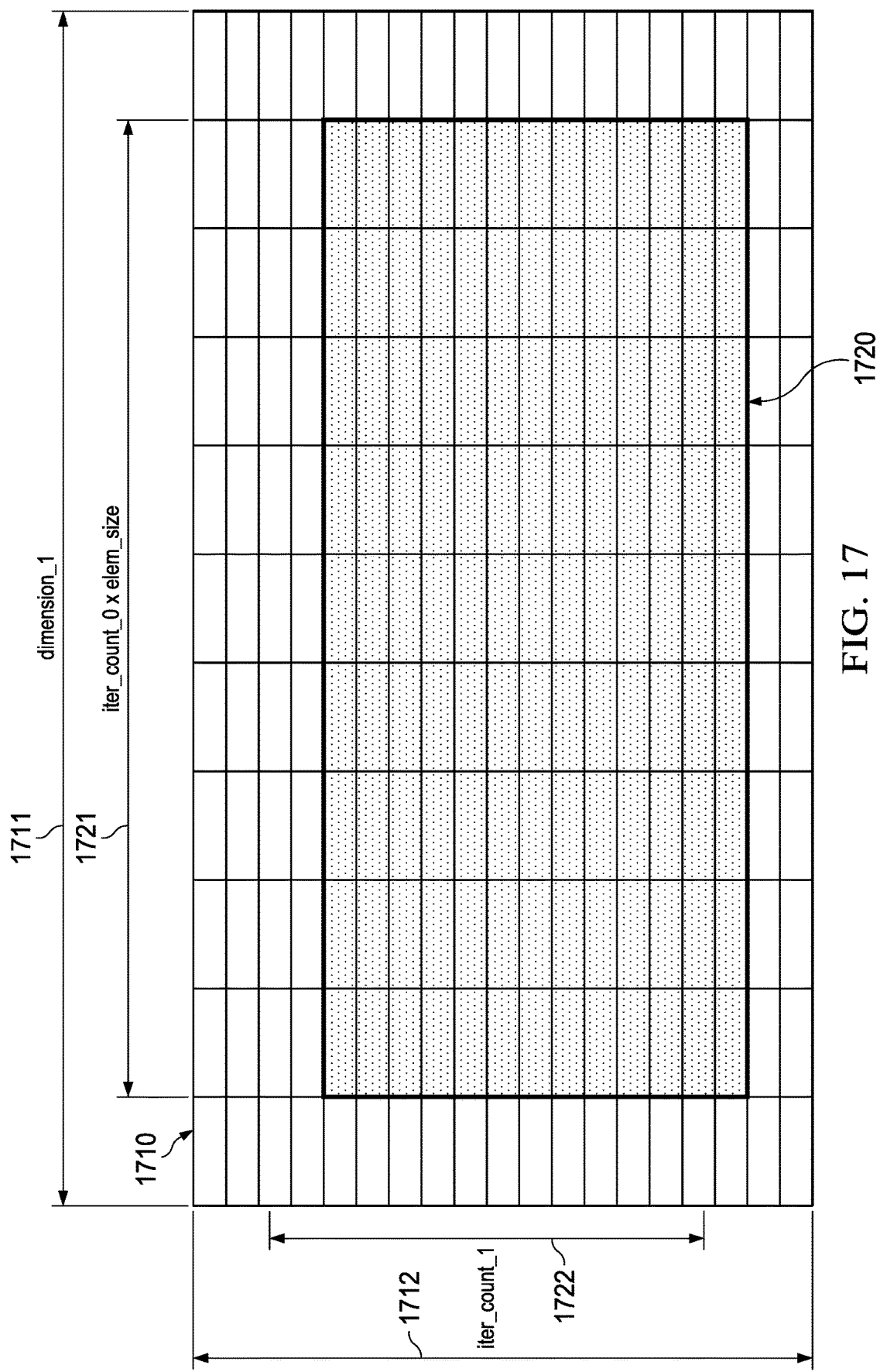
FIG. 17 illustrates a basic two dimensional stream.

FIG. 17 illustrates a basic two dimensional stream. The inner two dimensions, represented by ELEM_BYTES, ICNT0, DIM1 and ICNT1 give sufficient flexibility to describe extracting a smaller rectangle 1720 having dimensions 1721 and 1722 from a larger rectangle 1710 having dimensions 1711 and 1712. In this example rectangle 1720 is a 9 by 13 rectangle of 64-bit values and rectangle 1710 is a larger 11 by 19 rectangle. The following stream parameters define this stream:

ICNT0=9
ELEM_BYTES=8
ICNT1=13
DIM1=88 (11 times 8)

Thus the iteration count in the 0 dimension 1721 is 9. The iteration count in the 1 direction 1722 is 13. Note that the ELEM_BYTES only scales the innermost dimension. The first dimension has ICNT0 elements of size ELEM_BYTES. The stream address generator does not scale the outer dimensions. Therefore, DIM1=88, which is 11 elements scaled by 8 bytes per element.

Figure 18:
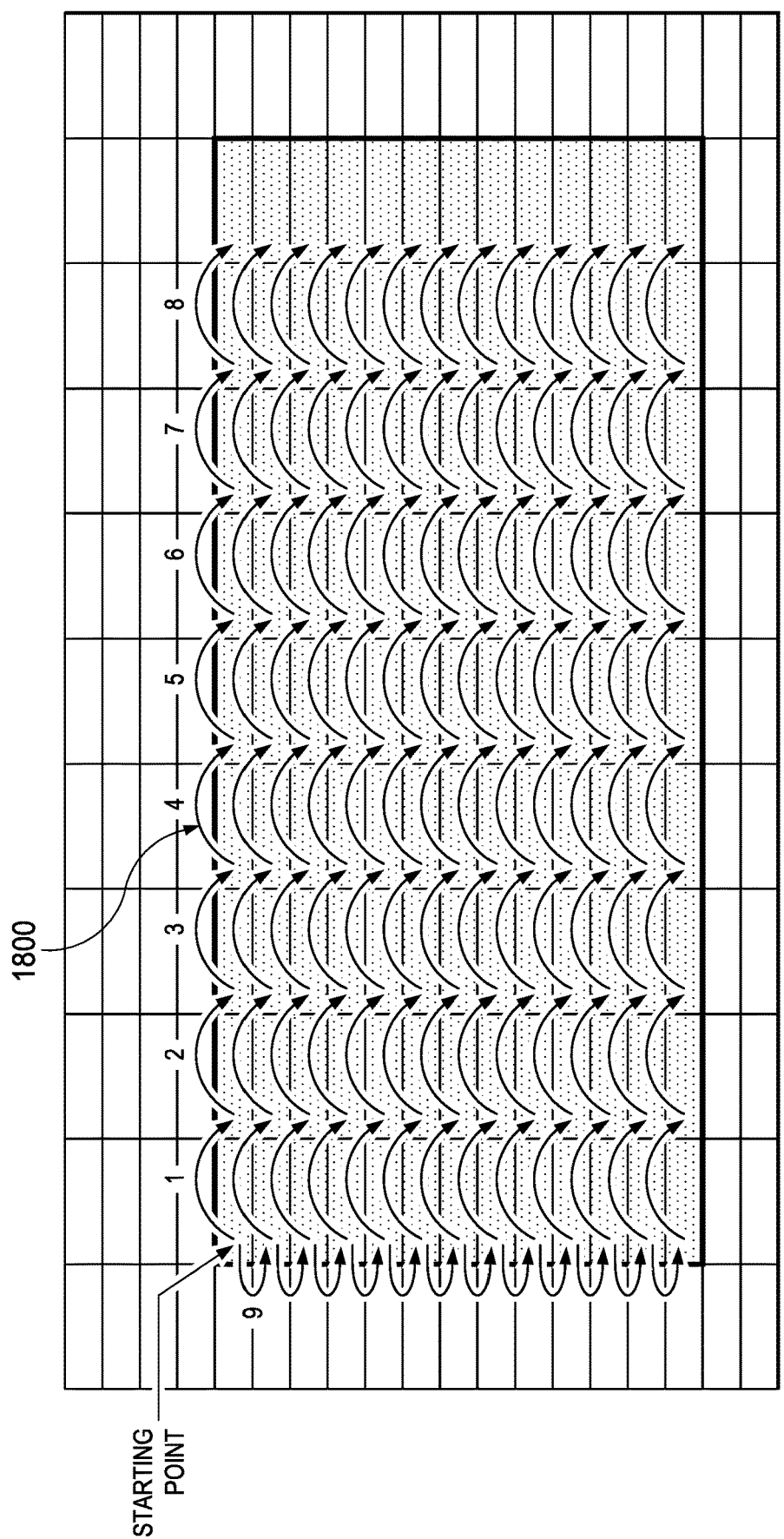
FIG. 18 illustrates the order of elements within the example stream of FIG. 17.

FIG. 18 illustrates the order of elements within this example stream. The streaming engine fetches elements for the stream in the order illustrated in order 1800. The first 9 elements come from the first row of rectangle 1720, left-to-right in hops 1 to 8. The 10th through 18th elements comes from the second row, and so on. When the stream moves from the 9th element to the 10th element (hop 9 in FIG. 18), the streaming engine computes the new location based on the pointer's position at the start of the inner loop, not where the pointer ended up at the end of the first dimension. This makes DIM1 independent of ELEM_BYTES and ICNT0. DIM1 always represents the distance between the first bytes of each consecutive row.

Figure 19:
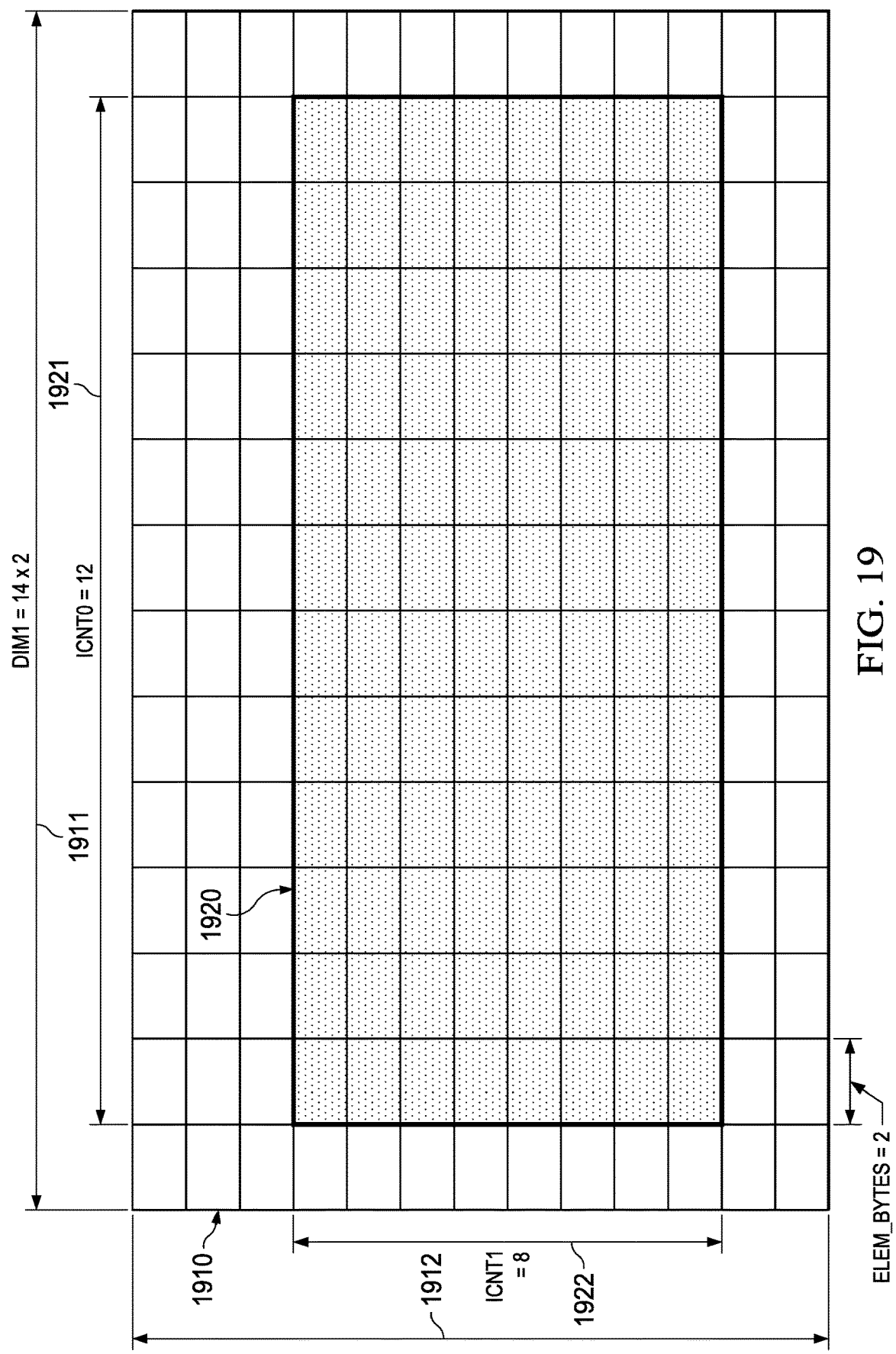
FIG. 19 illustrates extracting a smaller rectangle from a larger rectangle.

Transposed streams access along dimension 1 before dimension 0. The following examples illustrate a couple transposed streams, varying the transposition granularity. FIG. 19 illustrates extracting a smaller rectangle 1920 (12× 8) having dimensions 1921 and 1922 from a larger rectangle 1910 (14×13) having dimensions 1911 and 1912. In FIG. 10 ELEM_BYTES equals 2.

Figure 20:
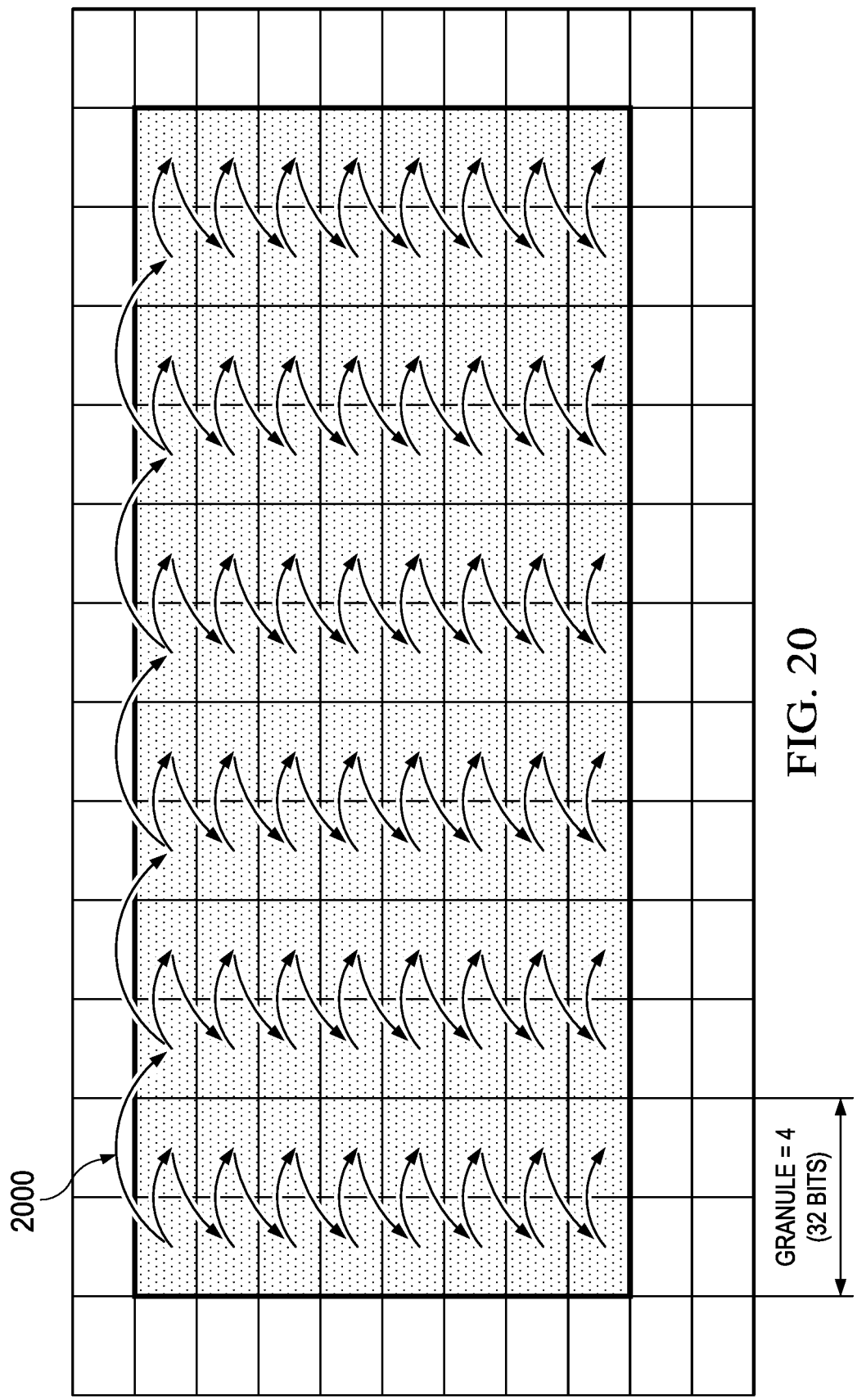
FIG. 20 illustrates how the streaming engine would fetch the stream of this example with a transposition granularity of 4 bytes.

FIG. 20 illustrates how the streaming engine would fetch the stream of this example with a transposition granularity of 4 bytes. Fetch pattern 2000 fetches pairs of elements from each row (because the granularity of 4 is twice the ELEM_BYTES of 2), but otherwise moves down the columns. Once it reaches the bottom of a pair of columns, it repeats this pattern with the next pair of columns.

Figure 21:
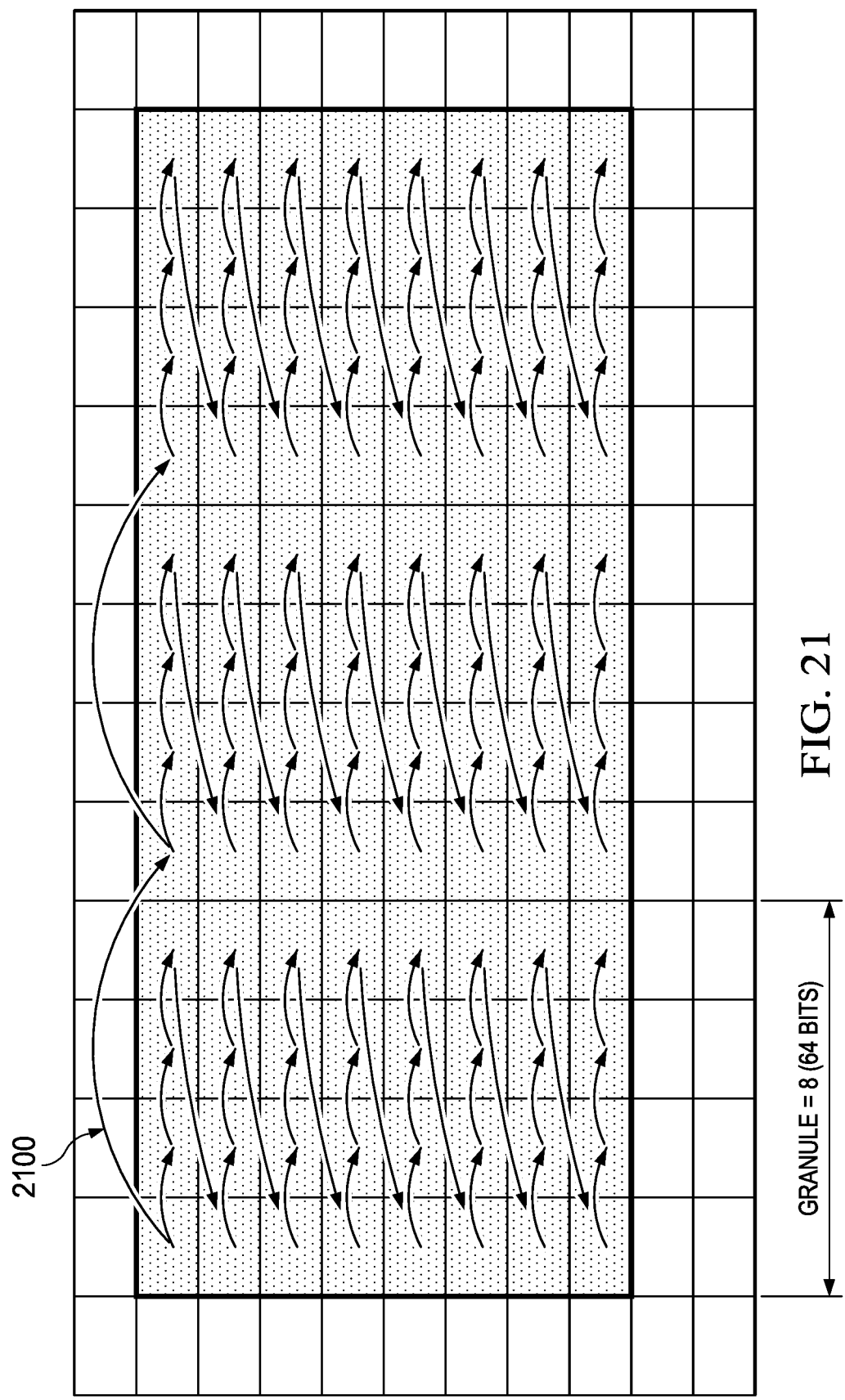
FIG. 21 illustrates how the streaming engine would fetch the stream of this example with a transposition granularity of 8 bytes.

FIG. 21 illustrates how the streaming engine would fetch the stream of this example with a transposition granularity of 8 bytes. The overall structure remains the same. The streaming engine fetches 4 elements from each row (because the granularity of 8 is four times the ELEM_BYTES of 2) before moving to the next row in the column as shown in fetch pattern 2100.

The streams examined so far read each element from memory exactly once. A stream can read a given element from memory multiple times, in effect looping over a piece of memory. FIR filters exhibit two common looping patterns. FIRs re-read the same filter taps for each output. FIRs also read input samples from a sliding window. Two consecutive outputs will need inputs from two overlapping windows.

Figure 22:
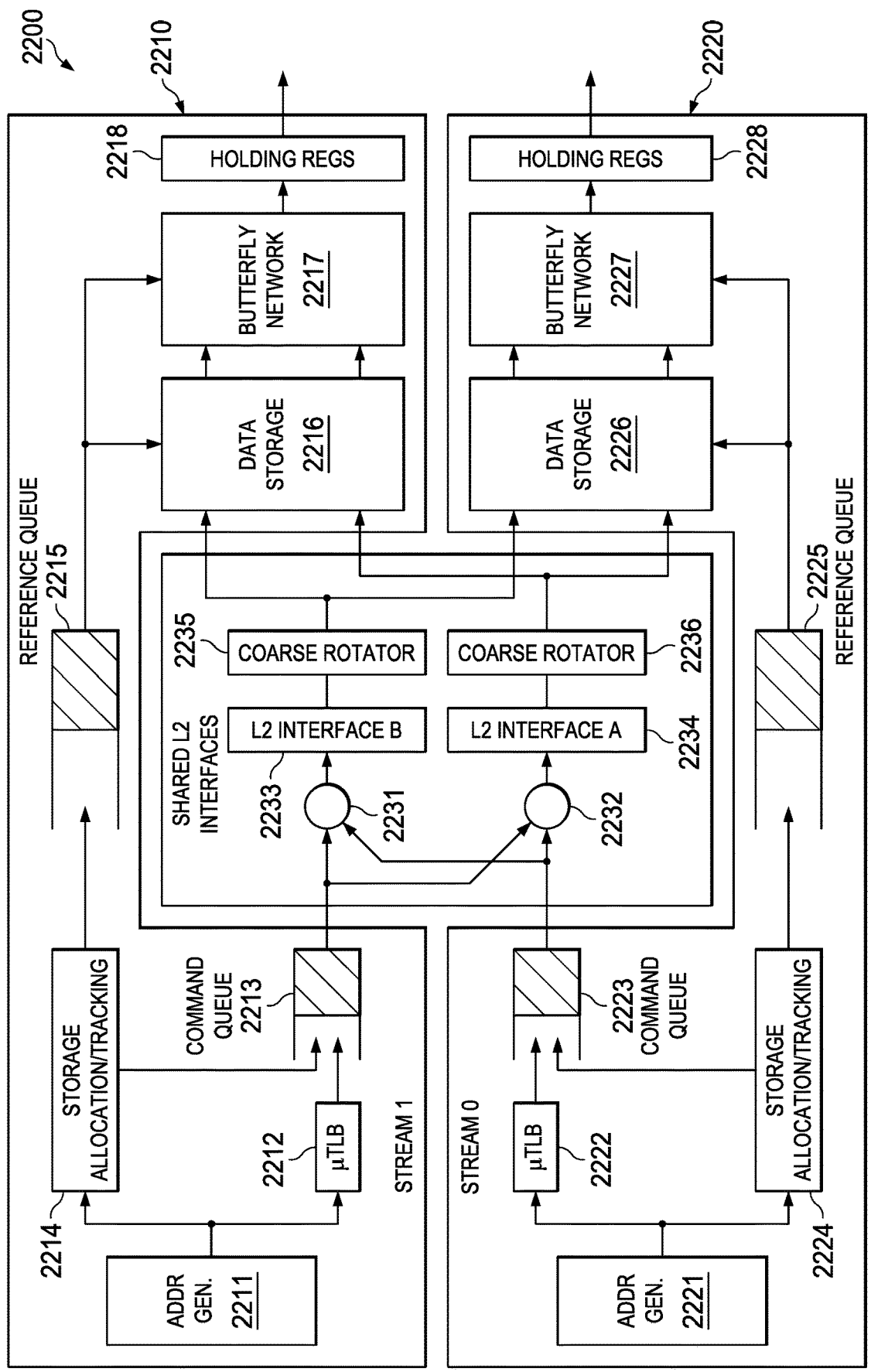
FIG. 22 illustrates the details of stream engine of this invention.

FIG. 22 illustrates the details of stream engine 2200. Streaming engine 220 contains three major sections: Stream 0 2210; Stream 1 2220; and Shared L2 Interfaces 2230. Stream 0 2210 and Stream 1 2220 both contain identical hardware that operates in parallel. Stream 0 2210 and Stream 1 2220 both share L2 interfaces 2230. Each stream 2210 and 2220 provides the CPU with up to 512 bits/cycle, every cycle. The streaming engine architecture enables this through its dedicated stream paths and shared dual L2 interfaces.

Each streaming engine 2200 includes a dedicated 4-dimensional stream address generator 2211/2221 that can each generate one new non-aligned request per cycle. Address generators 2211/2221 output 512-bit aligned addresses that overlap the elements in the sequence defined by the stream parameters. This will be further described below.

Each address generator 2211/2211 connects to a dedicated micro table look-aside buffer (µTLB) 2212/2222. The µTLB 2212/2222 converts a single 48-bit virtual address to a 44-bit physical address each cycle. Each µTLB 2212/2222 has 8 entries, covering a minimum of 32 kB with 4 kB pages or a maximum of 16 MB with 2 MB pages. Each address generator 2211/2221 generates 2 addresses per cycle. The µTLB 2212/2222 only translates 1 address per cycle. To maintain throughput, streaming engine 2200 takes advantage of the fact that most stream references will be within the same 4 kB page. Thus the address translation does not modify bits 0 to 11 of the address. If aout0 and aout1 line in the same 4 kB page (aout0[47:12] are the same aout1[47:12]), then the µTLB 2212/2222 only translates aout0 and reuses the translation for the upper bits of both addresses.

Translated addresses are queued in command queue 2213/2223. These addresses are aligned with information from the corresponding Storage Allocation and Tracking block 2214/2224. Streaming engine 2200 does not explicitly manage µTLB 2212/2222. The system memory management unit (MMU) invalidates µTLBs as necessary during context switches.

Storage Allocation and Tracking 2214/2224 manages the stream's internal storage, discovering data reuse and tracking the lifetime of each piece of data. Storage Allocation and Tracking 2214/2224 accepts 2 virtual addresses per cycle and binds those addresses to slots in the stream's data storage. Streaming engine 2200 organizes its data store as an array of slots. Streaming engine 2200 maintains the following metadata to track the contents and lifetime of the data in each slot.

TABLE 6

| | |
|---|---|
| Address | 48-bit virtual address associated with the slot |
| Valid | Single bit indicating whether the tag address is valid |
| Ready | Single bit indicating the data has arrived for this address |
| Active | Single bit indicating whether there are any references outstanding to this data |
| Last Reference | Value indicating the most recent reference to this slot in the reference queue |

Table 7 details the interaction of the valid, ready and active bits.

TABLE 7

| Valid | Ready | Active | Interpretation | Available for Allocation |
|---|---|---|---|---|
| 0 | — | — | Address invalid | Yes |
| 1 | 0 | 0 | Invalid, cannot have data pending without reference in flight | — |
| 1 | 0 | 1 | Request sent for slot, data pending | No |
| 1 | 1 | 0 | No active references in flight | Yes |
| 1 | 1 | 1 | Reference in flight, data available | No |

Using this metadata, the storage allocation and tracking 2214/2224 can identify data reuse opportunities in the stream. Storage allocation and tracking 2214/2224 performs the following steps for each address. It compares the address against the relevant tags in its tag array. On a hit, it cancels the command associated with this address. On a miss, it allocates a free slot, setting Valid=1, Ready=0 and updates the outgoing command to direct the data it is fetching to this slot. In either case, a slot number is associated with the address. Storage allocation and tracking 2214/2224 inserts the reference in the reference queue. Storage allocation and tracking 2214/2224 sets Active=1 and updates Last Reference to the position of the reference in the reference queue. This is the value of the reference queue's insertion pointer at the time of insertion. This process converts the generated addresses into the slot numbers that represent the data. From this point forward, the streaming engine need not track addresses directly.

To maximize reuse and minimize stalls, streaming engine 2200 allocates slots in the following order: the slot one after the most recent allocation if available in FIFO order; the lowest number available slot, if any; and if no slot available, stall and iterate these two steps until allocation succeeds. This will tend to allocate slots in FIFO order, but avoids stalling if a particular reuse pattern works against that order.

Reference queue 2215/2225 stores the sequence of references generated by the corresponding address generator 2211/2221. This information drives the data formatting network so that it can present data to the CPU in the correct order. Each entry in reference queue 2215/2225 contains the information necessary to read data out of the data store and align it for the CPU. Reference queue 2215/2225 maintains the following information in each slot:

TABLE 8

| | |
|---|---|
| Data Slot Low | Slot number for the lower half of data associated with aout0 |

TABLE 8-continued

| | |
|---|---|
| Data Slot High | Slot number for the upper half of data associated with aout1 |
| Rotation | Number of bytes to rotate data to align next element with lane 0 |
| Length | Number of valid bytes in this reference |

Storage allocation and tracking 2214/2224 inserts references in reference queue 2215/2225 as address generator 2211/2221 generates new addresses. Storage allocation and tracking 2214/2224 removes references from reference queue 2215/2225 when the data becomes available and there is room in the stream holding registers. As storage allocation and tracking 2214/2224 removes slot references from reference queue 2215/2225 and formats data, it checks whether the references represent the last reference to the corresponding slots. Storage allocation and tracking 2214/2224 compares reference queue 2215/2225 removal pointer against the slot's recorded Last Reference. If they match, then storage allocation and tracking 2214/2224 marks the slot inactive once it's done with the data.

Streaming engine 2200 has data storage 2216/2226 for an arbitrary number of elements. Deep buffering allows the streaming engine to fetch far ahead in the stream, hiding memory system latency. The right amount of buffering might vary generation to generation. In the current preferred embodiment streaming engine 2200 dedicates 32 slots to each stream. Each slot holds 64 bytes of data.

Butterfly network 2217/2227 consists of a 7 stage butterfly network. Butterfly network 2217/2227 receives 128 bytes of input and generates 64 bytes of output. The first stage of the butterfly is actually a half-stage. It collects bytes from both slots that match a non-aligned fetch and merges them into a single, rotated 64-byte array. The remaining 6 stages form a standard butterfly network. Butterfly network 2217/2227 performs the following operations: rotates the next element down to byte lane 0; promotes data types by one power of 2, if requested; swaps real and imaginary components of complex numbers, if requested; converts big endian to little endian if the CPU is presently in big endian mode. The user specifies element size, type promotion and real/imaginary swap as part of the stream's parameters.

Streaming engine 2200 attempts to fetch and format data ahead of the CPU's demand for it, so that it can maintain full throughput. Holding registers 2218/2228 provide a small amount of buffering so that the process remains fully pipelined. Holding registers 2218/2228 are not directly architecturally visible, except for the fact that streaming engine 2200 provides full throughput.

The two streams 2210/2220 share a pair of independent L2 interfaces 2230: L2 Interface A (IFA) 2233 and L2 Interface B (IFB) 2234. Each L2 interface provides 512 bits/cycle throughput direct to the L2 controller for an aggregate bandwidth of 1024 bits/cycle. The L2 interfaces use the credit-based multicore bus architecture (MBA) protocol. The L2 controller assigns each interface its own pool of command credits. The pool should have sufficient credits so that each interface can send sufficient commands to achieve full read-return bandwidth when reading L2 RAM, L2 cache and MSMC RAM.

To maximize performance, both streams can use both L2 interfaces, allowing a single stream to send a peak command rate of 2 commands/cycle. Each interface prefers one stream over the other, but this preference changes dynamically from request to request. IFA 2233 and IFB 2234 always prefer opposite streams, when IFA 2233 prefers Stream 0, IFB 2234 prefers Stream 1 and vice versa.

Arbiter 2231/2232 ahead of each interface 2233/2234 applies the following basic protocol on every cycle it has credits available. Arbiter 2231/2232 checks if the preferred stream has a command ready to send. If so, arbiter 2231/2232 choose that command. Arbiter 2231/2232 next checks if an alternate stream has at least two commands ready to send, or one command and no credits. If so, arbiter 2231/2232 pulls a command from the alternate stream. If either interface issues a command, the notion of preferred and alternate streams swap for the next request. Using this simple algorithm, the two interfaces dispatch requests as quickly as possible while retaining fairness between the two streams. The first rule ensures that each stream can send a request on every cycle that has available credits. The second rule provides a mechanism for one stream to borrow the other's interface when the second interface is idle. The third rule spreads the bandwidth demand for each stream across both interfaces, ensuring neither interface becomes a bottleneck by itself.

Coarse Grain Rotator 2235/2236 enables streaming engine 2200 to support a transposed matrix addressing mode. In this mode, streaming engine 2200 interchanges the two innermost dimensions of its multidimensional loop. This accesses an array column-wise rather than row-wise. Rotator 2235/2236 is not architecturally visible, except as enabling this transposed access mode.

Figure 23:
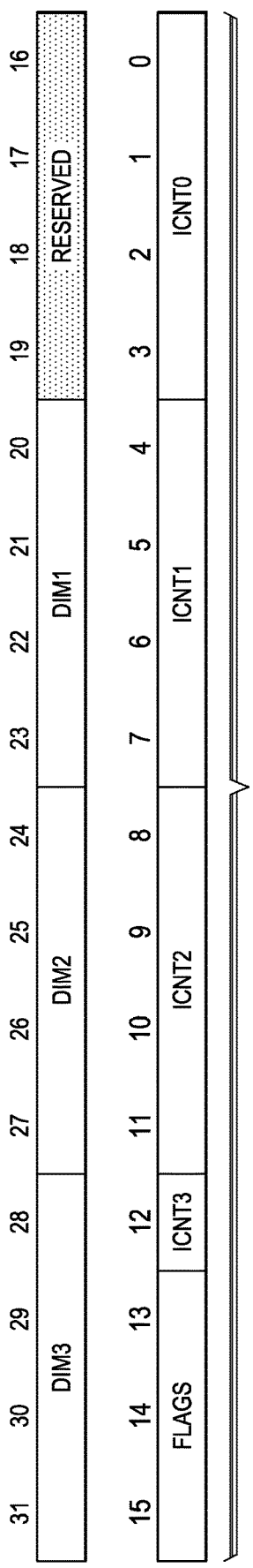
FIG. 23 illustrates a stream template register of this invention.

The stream definition template provides the full structure of a stream that contains data. The iteration counts and dimensions provide most of the structure, while the various flags provide the rest of the details. For all data-containing streams, the streaming engine defines a single stream template. All stream types it supports fit this template. The numbers above each field indicate byte numbers within a 256-bit vector. The streaming engine defines a four-level loop nest for addressing elements within the stream. Most of the fields in the stream template map directly to the parameters in that algorithm. FIG. 23 illustrates stream template register 2300. The numbers above the fields are byte numbers within a 256-bit vector. Table 9 shows the stream field definitions of a stream template.

TABLE 9

| Field Name | Description | Size Bits |
|---|---|---|
| ICNT0 | Iteration count for loop 0 (innermost) | 32 |
| ICNT1 | Iteration count for loop 1 | 32 |
| ICNT2 | Iteration count for loop 2 | 32 |
| ICNT3 | Iteration count for loop 3 (outermost) | 8 |
| DIM1 | Signed dimension for loop 1 | 32 |
| DIM2 | Signed dimension for loop 2 | 32 |
| DIM3 | Signed dimension for loop 3 | 32 |
| FLAGS | Stream modifier flags | 24 |

Note that DIM0 is always equal to is ELEM_BYTES defining physically contiguous data. The stream template includes mostly 32-bit fields. The stream template limits ICNT3 to 8 bits and the FLAGS field to 24 bits. Streaming engine 2200 interprets all iteration counts as unsigned integers and all dimensions unscaled signed integers. The template above fully specifies the type of elements, length and dimensions of the stream. The stream instructions separately specify starting address. This allows a program to open multiple streams using the same template.

Figure 24:
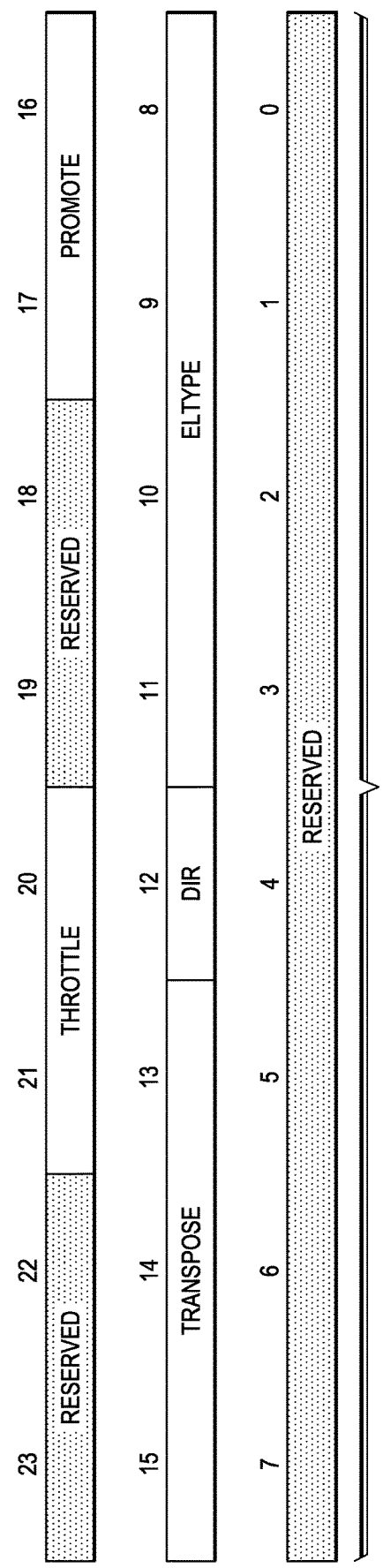
FIG. 24 illustrates sub-field definitions of the flags field of this invention.

FIG. 24 illustrates sub-field definitions of the flags field. As shown in FIG. 23 the flags field is 3 bytes or 24 bits. FIG. 24 shows bit numbers of the fields. Table 10 shows the definition of these fields.

TABLE 10

| Field Name | Description | Size Bits |
|---|---|---|
| ELTYPE | Type of data element | 4 |
| DIR | Stream direction 0 forward direction 1 reverse direction | 1 |
| TRANSPOSE | Two dimensional transpose mode | 3 |
| PROMOTE | Promotion mode | 2 |
| THROTTLE | Fetch ahead throttle mode | 2 |

The Element Type (ELTYPE) field defines the data type of the elements in the stream. The coding of the four bits of this field are defined as shown in Table 11.

TABLE 11

| ELTYPE | Sub-element Size Bits | Total Element Size Bits | Real-Complex | Bytes/Element |
|---|---|---|---|---|
| 0000 | 8 | 8 | real | 1 |
| 0001 | 16 | 16 | real | 2 |
| 0010 | 32 | 32 | real | 4 |
| 0011 | 64 | 64 | real | 8 |
| 0100 | | | reserved | |
| 0101 | | | reserved | |
| 0110 | | | reserved | |
| 0111 | | | reserved | |
| 1000 | 8 | 16 | complex no swap | 2 |
| 1001 | 16 | 32 | complex no swap | 4 |
| 1010 | 32 | 64 | complex no swap | 8 |
| 1011 | 64 | 128 | complex no swap | 16 |
| 1100 | 8 | 16 | complex swapped | 2 |
| 1101 | 16 | 32 | complex swapped | 4 |
| 1110 | 32 | 64 | complex swapped | 8 |
| 1111 | 64 | 128 | complex swapped | 16 |

Sub-Element Size determines the type for purposes of type promotion and vector lane width. For example, 16-bit sub-elements get promoted to 32-bit sub-elements when a stream requests type promotion. The vector lane width matters when the DSP CPU operates in big endian mode, as it always lays out vectors in little endian order.

Total Element Size determines the minimal granularity of the stream. In the stream addressing model, it determines the number of bytes the stream fetches for each iteration of the innermost loop. Streams always read whole elements, either in increasing or decreasing order.

Therefore, the innermost dimension of a stream spans ICNT0×total-element-size bytes.

Real-Complex Type determines whether the streaming engine treats each element as a real number of as the real and imaginary parts of a complex numbers. This field also specifies whether to swap the real and complex parts of complex numbers. Complex types have a total element size that is twice their sub-element size. Otherwise, the sub-element size equals total element size.

The TRANSPOSE field determines whether the streaming engine accesses the stream in a transposed order. The transposed order exchanges the inner two addressing levels. The TRANSPOSE field also indicated the granularity it transposes the stream. The coding of the four bits of this field are defined as shown in Table 12.

TABLE 12

| TRANSPOSE | Transpose Duplication | Granule Bytes | Stream Advance Rate |
|---|---|---|---|
| 0000 | both disabled | | 64 bytes |
| 0001 | | reserved | |
| 0010 | | reserved | |
| 0011 | transpose | 4 | 16 rows |
| 0100 | transpose | 8 | 8 rows |
| 0101 | transpose | 16 | 4 rows |
| 0110 | transpose | 32 | 2 rows |
| 0111 | | reserved | |
| 1000 | duplicate | 1 | 1 byte |
| 1001 | duplicate | 2 | 2 bytes |
| 1010 | duplicate | 4 | 4 bytes |
| 1011 | duplicate | 8 | 8 bytes |
| 1100 | duplicate | 16 | 16 bytes |
| 1101 | duplicate | 32 | 32 bytes |
| 1110 | | reserved | |
| 1111 | | reserved | |

Streaming engine 2200 actually transposes at a different granularity than the element size. This allows programs to fetch multiple columns of elements from each row. The transpose granularity must be no smaller than the element size.

The PROMOTE field controls whether the streaming engine promotes sub-elements in the stream and the type of promotion. When enabled, streaming engine 2200 promotes types by a single power-of-2 size. The coding of the two bits of this field are defined as shown in Table 13.

TABLE 13

| PROMOTE | Description |
|---|---|
| 00 | no promotion |
| 01 | unsigned integer promotion, zero extend |
| 10 | signed integer promotion, sign extend |
| 11 | floating point promotion |

When the stream specifies No promotion, each sub-element occupies a vector lane equal in width to the size specified by ELTYPE. Otherwise, each sub-element occupies a vector lane twice as large. When PROMOTE is 00, the streaming engine fetches half as much data from memory to satisfy the same number of stream fetches.

Promotion modes 01b and 10b treat the incoming sub-elements as unsigned and signed integers, respectively. For unsigned integers, the streaming engine promotes by filling the new bits with zeros. For signed integers the streaming engine promotes by filling the new bits with copies of the sign bit. Positive signed integers have a most significant bit equal to 0. On promotion of positive signed integers, the new bits are zero filled. Negative signed integers have a most significant bit equal to 1. On promotion of negative signed integers, the new bits are 1 filled.

Promotion mode 11b treats the incoming sub-elements as floating point numbers. Floating point promotion treats each sub-element as a floating point type. The streaming engine supports two floating point promotions: short float (16-bit) to single precision float (32-bit); single precision float (32-bit) to double precision float (64-bit).

The THROTTLE field controls how aggressively the streaming engine fetches ahead of the CPU. The coding of the two bits of this field are defined as shown in Table 14.

TABLE 14

| THROTTLE | Description |
|---|---|
| 00 | Minimum throttling, maximum fetch ahead |
| 01 | Less throttling, more fetch ahead |
| 10 | More throttling, less fetch ahead |
| 11 | Maximum throttling, minimum fetch ahead |

THROTTLE does not change the meaning of the stream, and serves only as a hint. The streaming engine may ignore this field. Programs should not rely on the specific throttle behavior for program correctness, because the architecture does not specify the precise throttle behavior. THROTTLE allows programmers to provide hints to the hardware about the program's own behavior. By default, the streaming engine attempts to get as far ahead of the CPU as it can to hide as much latency as possible, while providing full stream throughput to the CPU. While several key applications need this level of throughput, it can lead to bad system level behavior for others. For example, the streaming engine discards all fetched data across context switches. Therefore, aggressive fetch-ahead can lead to wasted bandwidth in a system with large numbers of context switches. Aggressive fetch-ahead only makes sense in those systems if the CPU consumes data very quickly.

The DSP CPU exposes the streaming engine to programs through a small number of instructions and specialized registers. A STROPEN instruction opens a stream. The STROPEN command specifies a stream number indicating opening stream 0 or stream 1. The STROPEN specifies a stream template register which stores the stream template as described above. The STROPEN command specifies an address register which is a 64-bit register storing the stream starting address. If the specified stream is active the STROPEN command replaces the current stream with the specified stream.

A STRCLOSE instruction closes a stream. The STRCLOSE command specifies the stream number of the stream to be closed.

A STRSAVE instruction captures sufficient state information of a specified stream to restart that stream in the future. A STRRSTR instruction restores a previously saved stream. A STRSAVE instruction does not save any of the data of the stream. A STRSAVE instruction saves only metadata. The stream re-fetches data in response to a STRRSTR instruction.

Streaming engine is in one of three states: Inactive; Active; or Frozen. When inactive the streaming engine does nothing. Any attempt to fetch data from an inactive streaming engine is an error. Until the program opens a stream, the streaming engine is inactive. After the program consumes all the elements in the stream or the program closes the stream, the streaming engine also becomes inactive. Programs which use streams explicitly activate and inactivate the streaming engine. The operating environment manages streams across context-switch boundaries via the streaming engine's implicit freeze behavior, coupled with its own explicit save and restore actions.

Active streaming engines have a stream associated with them. Programs can fetch new stream elements from active streaming engines. Streaming engines remain active until one of the following. When the stream fetches the last element from the stream, it becomes inactive. When program explicitly closes the stream, it becomes inactive. When CPU responds to an interrupt or exception, the streaming engine freezes. Frozen streaming engines capture all the state necessary to resume the stream where it was when the streaming engine froze. The streaming engines freeze in response to interrupts and exceptions. This combines with special instructions to save and restore the frozen stream context, so that operating environments can cleanly switch contexts. Frozen streams reactivate when the CPU returns to the interrupted context.

Programs access stream data via a pair of special vector registers STX0 and STX1. These registers are outside the other register files. These registers represent the head of stream for streams 0 and 1. To read from a stream, the program uses *STX0 or *STX1, which is a reference to these special registers, in place of a vector or double vector register source operand. A read itself does not advance the stream. A iteration modifier ++ when used with the special register designation causes the stream to advance.

Figure 25:
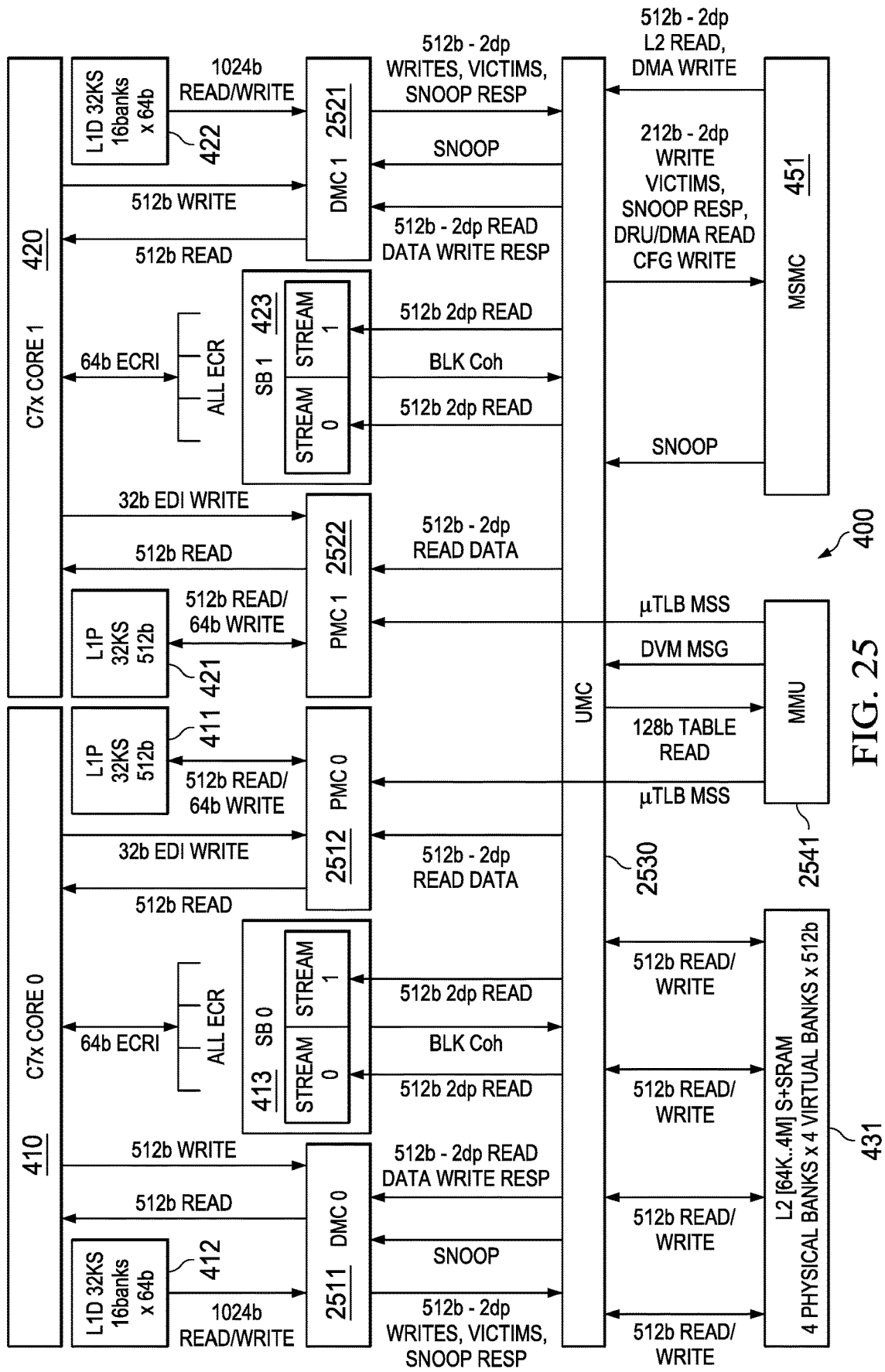
FIG. 25 illustrates another view of dual core vector processor emphasizing the cache controllers.

FIG. 25 illustrates another view of dual core vector processor 400. This view in FIG. 25 emphasizes cache controllers: program memory controllers (PMC) 2511 and 2521 controlling data transfer to and from level 1 program caches 411 and 421; data memory controllers (DMC) 2512 and 2522 controlling data transfer into and out of level 1 data caches 412 and 422. FIG. 25 also illustrates unified memory controller (UMC) 2530 controlling data transfers to and from level two (L2) cache 131. As illustrated in FIGS. 4 and 25 L2 cache 431 is shared between the DSP cores 410 and 420.

The memory system illustrated in FIG. 25 is the next generation caches and memory controller system for fixed and floating point DSP. It provides the capability of supporting up to two such CPU cores, each with its private L1 caches and controllers, a stream buffer, and a shared L2 cache controller. It can provide bandwidth of up to 2048-bits of data per cycles, which is an 8 times bandwidth improvement over previous generations. The L1D can sustain 512-bits of data to the CPU every cycle, while the L2 can provide 1024-bits of data to each stream buffer every cycle. The L1 and L2 controllers have the ability to queue up multiple transactions out to the next level of memory, and can handle out of order data return. The L1P controller supports branch exit prediction from the CPU and can queue up multiple prefetch misses to L2.

This memory system has full soft error correction (ECC) on its data and TAG rams. This novel ECC scheme cover many pipeline and interface registers, in addition to memories. This memory system support full memory coherency, where all the internal caches and memories (L1, L2) are kept coherent to each other and external caches and memories (MSMC, L3, DDR). The shared L2 controller keeps the multiple L1D's attached to it coherent to each other, and to the next level of caches (L2, L3, etc.)

This memory system supports virtual memory, and includes as part of it address translation, uTLBs, L2 page table walk, L1P cache invalidates and DVM messages. The shared L2 controller can support up to two stream buffers, each with two streams. The stream buffers are kept coherent to the L1D cache, and have a pipelines, high bandwidth interface to L2.

The L1D cache is backed up by a victim cache, has a larger cache line size (128-bytes), and implements aggressive write merging. New features include Look-up table, Histogram, and Atomic accesses. Cache changes in the L1P include higher associativity (4-way), and a larger cache line size (64-bytes). The L2 cache also features higher associativity (8-ways).

FIG. 25 shows the interfaces between the various blocks. The dual core vector processor 400 consists of: two CPU cores 410 and 420; two L1 Data Cache Controllers (DMC) 2511 and 2521, each with its private 32 KB L1D cache 411 and 421; two L1 Program Cache Controllers (PMC) 2512 and 2522, each with its private 32 KB L1I cache 412 and 422; two Stream Buffers (SB) 413 and 424, each with two streams; L2 Unified Cache Controller (UMC) 2530, with a shared L2 cache and SRAM 431 up to 2M bytes.

All interfaces, with the exception of the CPU-L1 interface, follow the MBA protocol. These data paths include: CPU-DMC 512-bit Read and 512-bit Write; CPU-PMC 512-bit Read and 32-bit Emulation Write; DMC-UMC 512-bit Read, 512-bit Write interfaces, that can do cache transactions, snoop and configuration accesses handling 2 dataphase transactions; PMC-UMC 512-bit Read, which supports 2 dataphase reads; SB-UMC 512-bit Read, which can be either 1 or 2 dataphases; UMC-MSMC 512 bit-Read and 512-bit Write, with Snoop and DMA transactions overlapped; MMU-UMC Page table walks from L2, and any DVM messages; MMU-PMC uTLB miss to MMU.

The two PMC controllers 2511/2521 are identical and the features listed here are supported on both. L1P Cache 411 and 421 have these attributes: 32 KB L1P cache; 4-Way Set Associative; 64-byte cache line size; Virtually Indexed and Virtually Tagged (48-bit virtual address); Two dataphase data return on misses from L2, for prefetching. PMC controllers 2511/2521 support Prefetch and Branch Prediction with the Capability to queue up to a variable number (up to 8) fetch packet requests to UMC to enable deeper prefetch in program pipeline. PMC controllers 2511/2521 include Error Detection (ECC) having: parity protection on Data and Tag rams: 1-bit error detection for tag and data RAMS; Data RAM parity protection is on instruction width granularity (1 parity bit every 32 bits); and Auto-Invalidate and Re-Fetch on errors in TAG RAM. PMC controllers 2511/2521 support Global Cache coherence operations. PMC controllers 2511/2521 provide Virtual Memory by Virtual to Physical addressing on misses and have a µTLB to handle address translation and for code protection. PMC controllers 2511/2521 provide Emulation including access codes that will be returned on reads to indicate the level of cache that the data was read from and bus error codes will be returned to indicate pass/fail status of emulation reads and writes. PMC controllers 2511/2521 provide Extended Control Register Access including L1P ECR registers accessible from the CPU through a non-pipelined interface. These registers will not be memory mapped, and instead will be mapped to a MOVC CPU instruction.

The two DMC controllers 2512/2522 are identical and the features listed here are supported on both. L1D Cache 412 and 422 are Direct Mapped Cache, in parallel with a 8/16 entry fully associative victim cache. L1D Cache 412 and 422 are 32 KB configurable down to 8 KB cache. L1D Cache 412 and 422 have a 128 byte cache line size. L1D Cache 412 and 422 are read Allocate Cache support for both Write-Back and Write-Through modes. L1D Cache 412 and 422 are Physically Indexed, Physically Tagged (44-bit physical address), support Speculative Loads, Hit under Miss, have posted write miss support and provide write Merging on all outstanding write transactions inside L1D. L1D Cache 412 and 422 support a FENCE operation on outstanding transactions.

The L1D SRAM part of L1D Cache 412 and 422 support L1D SRAM accesses from CPU and DMA and have limited size configurability on SRAM.

DMC controllers 2512/2522 include Lookup Table and Histogram capability to support 16 parallel table lookup and histogram.

Figure 26:
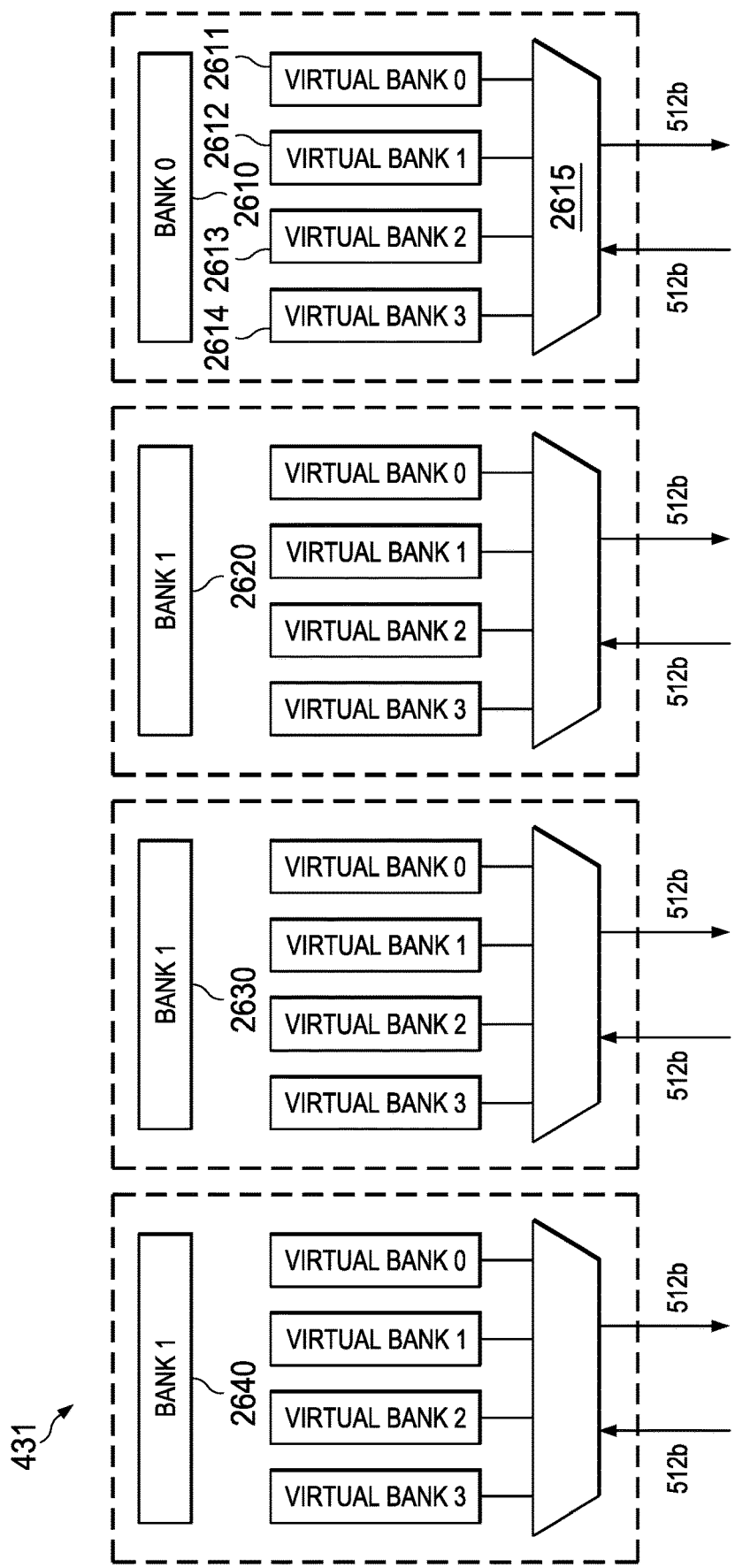
FIG. 26 illustrates the four banks each with four virtual banks of the L2 SRAM/cache of this invention.

DMC controllers 2512/2522 have 512-bit CPU Load/Store Bandwidth, 1024 Bit L1D Memory bandwidth. DMC controllers 2512/2522 support 16 64-bit wide Banks with up to outstanding load misses to L2. This is illustrated in FIG. 26. There are four banks 2610, 2620, 2630 and 2640. As noted in FIG. 26 bank 2601 includes four virtual banks 2611, 2612, 2613 and 2614. The other banks similarly include four virtual banks.

DMC controllers 2512/2522 includes Error Detection and Correction (ECC). DMC controllers 2512/2522 supports ECC Detection and Correction on a 32-bit granularity. This includes Full ECC on Data and Tag RAMS with 1-bit error correction and 2-bit error detection for both. DMC controllers 2512/2522 provide ECC syndrome on writes and victims out to L2. DMC controllers 2512/2522 receive ECC syndromes with read data from L2, and will do detection and correction before presenting this data to CPU. DMC controllers 2512/2522 provides full ECC on victim cache. DMC controllers 2512/2522 provide read-modify-write support to prevent parity corruption on half-word or byte writes. The ECC L2-L1D interface delays correction for Read-Response data pipeline ECC protection.

DMC controllers 2512/2522 provide emulation by returning access codes on reads to indicate the level of cache that the data was read from. Bus error codes will be returned to indicate pass/fail status of emulation reads and writes.

DMC controllers 2512/2522 provide atomic operations on Compare and Swap to cacheable memory space and increment to cacheable memory space.

DMC controllers 2512/2522 provides coherence including fully MESI support in both Main and Victim Cache. DMC controllers 2512/2522 support Global Cache coherence operations including snoops and Cache Maintenance operation support from L2, snoops for L2 SRAM, MSMC SRAM and External (DDR) addresses and full tag-RAM comparisons on Snoop and Cache Maintenance operations.

DMC controllers 2512/2522 provide virtual Memory support for wider (44 bit) physical address.

DMC controllers 2512/2522 support Extended Control Register Access. L1D ECR registers will be accessible from the CPU through a non-pipelined interface. These registers will not be memory mapped, and instead will be mapped to a MOVC CPU instruction.

UMC 2530 controls data flow into and out of L2 cache 431. L2 cache 431 is 8-Way Set Associative, supports cache sizes 64 KB to 1 MB. L2 cache 431 includes random least recently used (LRU). L2 cache 431 has a 128 byte cache line size. L2 cache 431 has a write-allocate policy and supports write-back and write-through modes. L2 cache 431 performs a cache Invalidate on cache mode change which is configurable and can be disabled. L2 cache 431 is physically Indexed, Physically Tagged (44-bit physical address) including 4 times Banked TAG RAM's, which allow four independent split pipelines. L2 cache 431 supports 4 64 byte streams from two stream buffers, 2 L1D and 2 L1P caches and configuration and MDMA accesses on an unified interface to MSMC. L2 cache 431 caches MMU page tables.

The L2 SRAM part of L2 cache 431 is 4×512-bit physical banks with 4 virtual bank each. Each bank has independent access control. L2 SRAM includes a security Firewall on L2 SRAM accesses. L2 SRAM supports DMA access on a merged MSMC I/F.

UMC 2530 provides prefetch hardware and On-demand prefetch to External (DDR), MSMC SRAM and L2 SRAM.

UMC 2530 provides Error Detection and correction (ECC) on a 256-bit granularity. There is full ECC Support for both TAG and Data RAMS with 1-bit error correction and 2-bit error detection for both. UMC 2530 provides ECC syndrome on writes and victims out to MSMC. UMC 2530 Read-Modify-Writes on DMA/DRU writes to keep parity valid and updated. ECC Correction and generation of multiple parity bits to L1P and Stream Buffer. This includes an auto-scrub to prevent accumulation of 1-bit errors, and to refresh parity. This clears and resets parity on system reset.

UMC 2530 provide emulation by returning access codes on reads to indicate the level of cache that the data was read from. Bus error codes will be returned to indicate pass/fail status of emulation reads and writes.

UMC 2530 supports full Coherence between 2 L1Ds, 4 Streams, L2 SRAM, MSMC SRAM and External (DDR). This includes multiple L1D to shared L2 Coherence, snoops for L2 SRAM, MSMC SRAM and External (DDR) addresses. This coherence has full MESI support. UMC 2530 includes user Coherence commands from Stream Buffer and support for Global Coherence operations.

UMC 2530 supports Extended Control Register Access. L1D ECR registers will be accessible from the CPU through a non-pipelined interface. These registers will not be memory mapped, and instead will be mapped to a MOVC CPU instruction.

Figure 27:
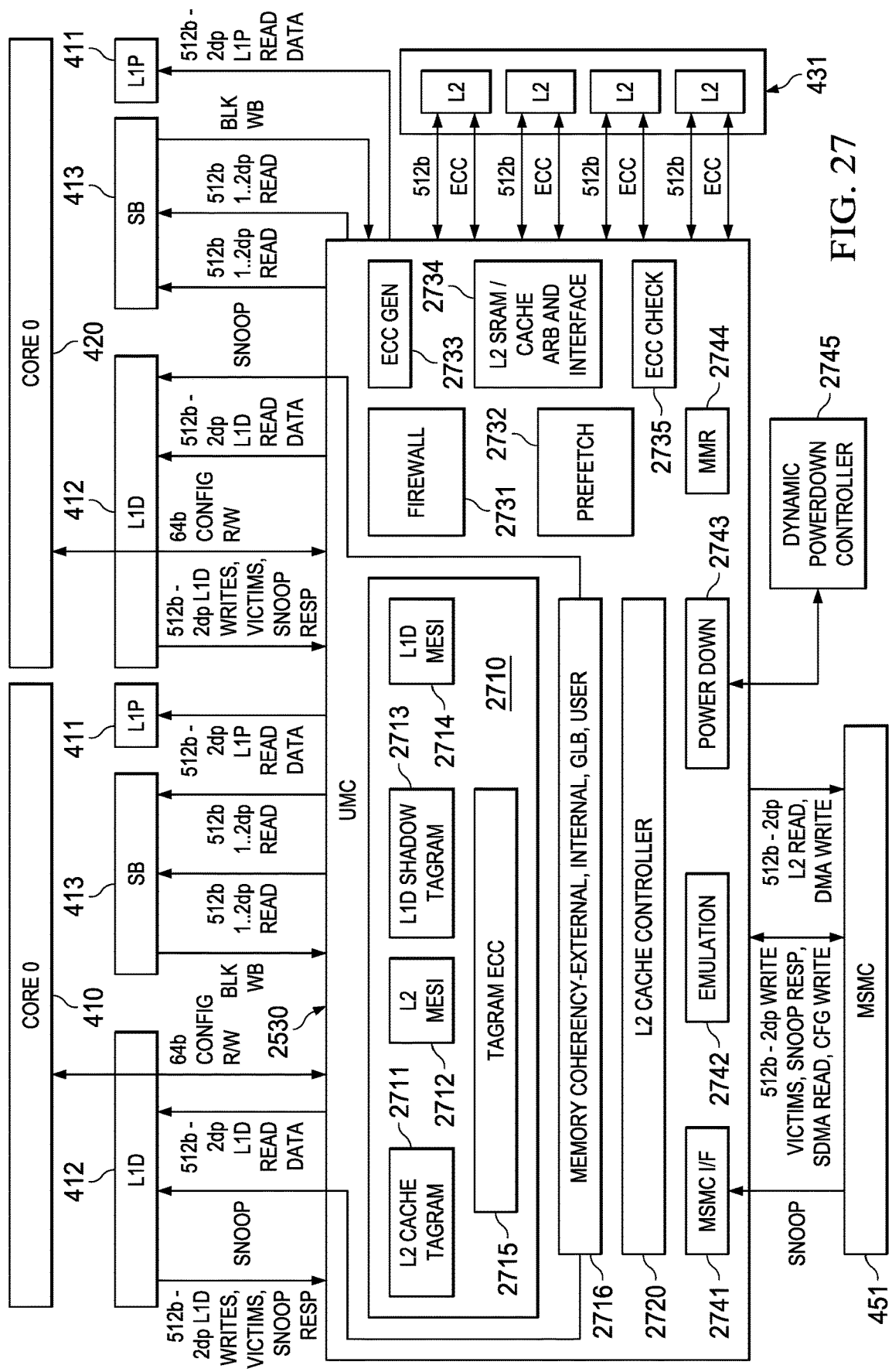
FIG. 27 illustrates details of the unified memory controller of this invention.

FIG. 27 illustrates details of UMC 2530. Parts illustrated in FIGS. 4 and 25 are given the same reference numbers. UMC 2530 includes tag portion 2710. Tag portion 2710 includes L2 cache tag RAM 2711 and L2 MESI memory 2712. UMC 2530 shadows L1D tags in L1D shadow tag RAM 2713 and L1D MESI memory 2714. Tag RAM ECC unit 2714 provides error detection and correction for the plural tag memories. A memory coherence unit 2716 provides coherence to the system.

UMC 2530 includes L2 cache controller 2720 controlling all operations.

UMC 2530 interfaces with L2 cache 431 (including the four banks illustrated in FIG. 26) via firewall 2731, prefetch unit 2732, error correction code generator 2733, L2 SRAM/Cache arbitration and interface 2734 and error correct checked 2735.

UMC 2530 includes other external connections. MSMC interface 2741 interfaces with MSMC 451. Emulation unit 2741 captures the state for debug and program production. Powerdown controller 2743 connects to external dynamic powerdown controller 2745. Memory mapped registers reside within block 2744.

Figure 28:
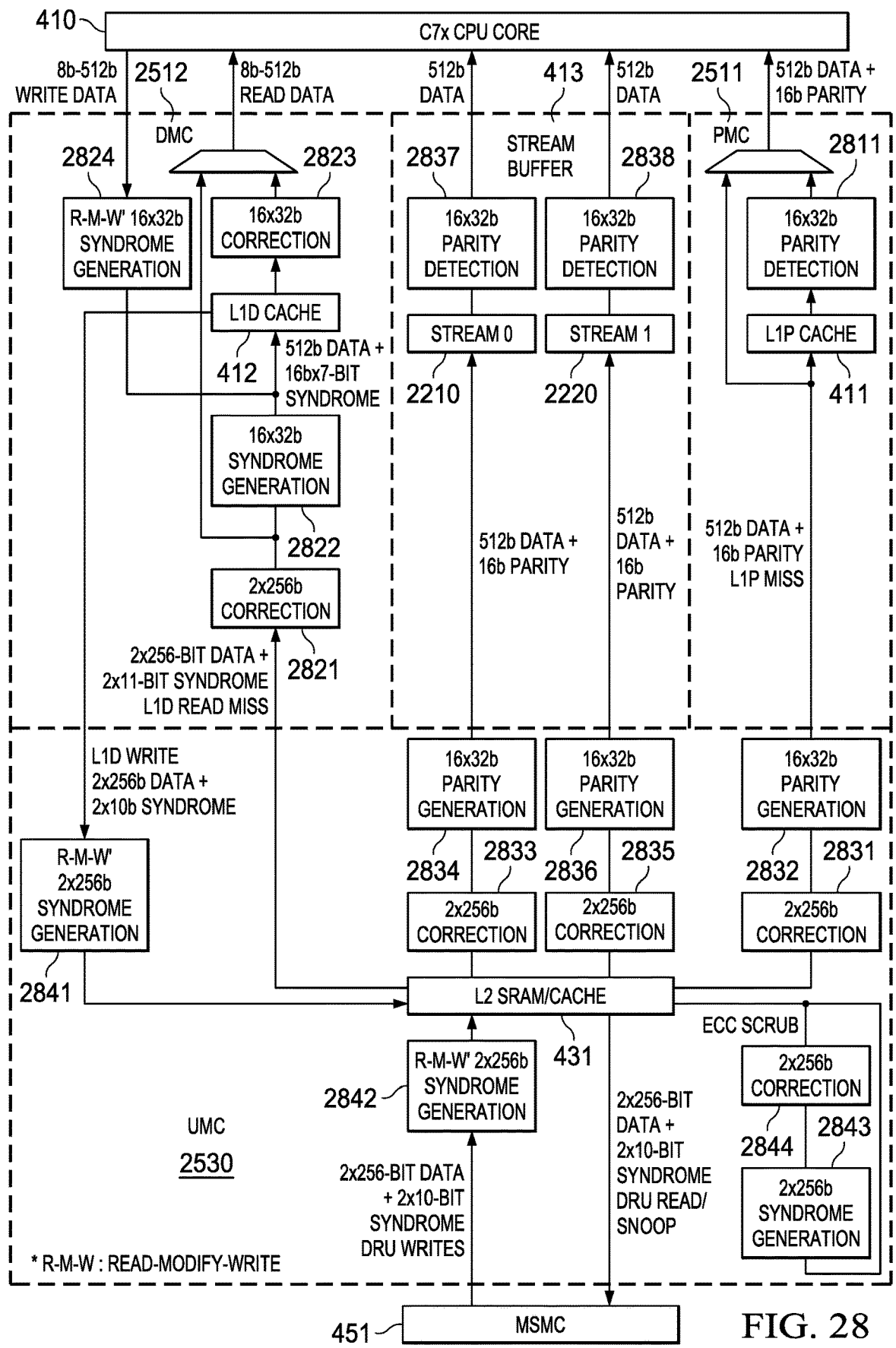
FIG. 28 illustrates the error detection and correction of this invention.

FIG. 28 illustrates the error detection and correction of this invention. Parts illustrated in FIGS. 4, 25 and 27 are given the same reference numbers. FIG. 28 illustrates only one CPU core. The connections to the second core are identical. Illustration of the second core is omitted from FIG. 28 for simplicity.

L1P cache 411 receives data from L2 SRAM/cache via 2×256 bit correction unit 2831 and 16×32 bit parity generator 2832. On supply of instructions to CPU core 410 the parity bits stored in L1P cache 411 are compared with newly calculated parity bits in 16×32 bit parity detector 2811. If they match the instructions are supplied to CPU core 410. If they do not match, the instructions are recalled from L2 SRAM/cache 431, then subject to the parity test again.

L1D cache 412 receives data from L2 SRAM/cache via 2×256 bit correction unit 2821 and 16×32 bit parity generator 2822. On supply of data to CPU core 410 the parity bits stored in L1D cache 412 are compared with newly calculated parity bits in 16×32 bit parity detector 2823. If they match the data is supplied to CPU core 410. If they do not match, the data is recalled from L2 SRAM/cache 431, then subject to the parity test again.

Writes from CPU core 410 are subject to parity generation in 16×32 bit syndrome generator 2824. The data received from CPU core 410 and the calculated parity bits are stored in L1D cache 412.

On write back from L1D cache 412, newly calculated parity bits and the stored parity are compared in 2×256 bit syndrome generator 2841. If the match, the data is stored in L2 SRAM/cache 431. If they do not match, 2×256 bit syndrome generator 2841 attempts correction. If the correction is achieved, the data is stored in L2 SRAM/cache 431. Failure of correction generates a fault.

The two streams 2210 and 2220 operate similarly. Stream 2210 receives data from L2 SRAM/cache via 2×256 bit correction unit 2833 and 16×32 bit parity generator 2834. On supply of data to CPU core 410 the parity bits stored in stream 2210 are compared with newly calculated parity bits in 16×32 bit parity detector 2837. If they match the data is supplied to CPU core 410. If they do not match, there is a fault. Stream 2220 operates similarly with 2×256 bit correction unit 2835, 16×32 bit parity generator 2836, and 16×32 bit parity detector 2838.

L2 SRAM/cache 431 receives data from MSMC 451 via 2×256 bit syndrome generator. New parity is generated for storage in L2 SRAM/cache 431 and correction is attempted if needed. Upon a non-match and failure of correction, the data is recalled from MSMC 451, then subject to the parity test again. There are no parity checks or correction on writes from L2 SRAM/cache 431 to MSMC 451.

2×256 bit syndrome generation 2843 and 2×256 correction 2844 periodically walk through the data stored in L2 SRAM/cache 431. The data and parity is recalled, new parity generated and checked and correction attempted if needed. If the data is correct, there is no change made in L2 SRAM/cache 431. If data is corrected, the corrected data is stored back in L2 SRAM/cache 431. Failure of data correction generates a fault.

While this specification contains many specifics, these should not be construed as limitations on the scope of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results unless such order is recited in one or more claims. In certain circumstances, multitasking and parallel processing may be advantageous.

Moreover, the separation of various system components in the embodiments described above should not be understood as requiring such separation in all embodiments.

What is claimed is:

1. A data processing apparatus comprising:
   a processing core;
   a memory; and
   a streaming engine configured to receive a plurality of data elements stored in the memory and to provide the plurality of data elements as a data stream to the processing core in response to an instruction, wherein all of the data elements of the data stream have a same data size, wherein the data size is specified by one or more control bits indicated by the instruction, and wherein the streaming engine includes:
   an address generator to generate addresses corresponding to locations in the memory;
   a buffer to store the data elements received from the locations in the memory corresponding to the generated addresses;
   a holding register coupled to the buffer to store a set of data elements received from the buffer; and
   an output to supply the set of data elements stored in the holding register to the processing core as at least part of the data stream.

2. The data processing apparatus of claim 1, wherein the streaming engine further includes a data formatter configured to format the data elements stored in the buffer according to a specified stream definition, wherein the instruction identifies the specified stream definition and the one or more control bits are part of the specified stream definition.

3. The data processing apparatus of claim 2, wherein the one or more control bits additionally specify a data element type of the data elements of the data stream, wherein all data elements of the stream are of the specified data element type, and wherein the specified data element type is selected from a plurality of data element types.

4. The data processing apparatus of claim 3, wherein the data element type is selected as a real number or as a complex number having a real component and an imaginary component.

5. The data processing apparatus of claim 3, further comprising a data bus coupled to the output of the streaming engine and to the processing core, wherein the data stream is supplied to the processing core via the data bus and the data bus is divisible into a plurality of equally sized lanes.

6. The data processing apparatus of claim 5, wherein:
   each of the plurality of data element types has a respective sub-element size;
   the specified stream definition includes information that specifies whether or not the data elements of the data stream are to be promoted;
   when the data elements of the data stream are not to be promoted, each data element occupies a lane of the data bus having a size equal to the sub-element size corresponding to the data element type of the data element; and
   when the data elements of the data stream are to be promoted, each data element occupies a lane of the data bus having a size equal to twice the sub-element size corresponding to the data element type of the data element.

7. The data processing apparatus of claim 6, wherein the information that specifies whether or not the data elements of the data stream are to be promoted indicates a first value corresponding to no promotion when the data elements of the data stream are not to be promoted and indicates a value other than the first value when the data elements of the data stream are to be promoted.

8. The data processing apparatus of claim 7, wherein the value other than the first value is selected from a plurality of values each corresponding to a respective promotion type.

9. The data processing apparatus of claim 8, wherein the plurality of values includes:
a second value corresponding to an unsigned integer promotion with zero extension;
a third value corresponding to an signed integer promotion with sign extension; and
a fourth value corresponding to a floating point promotion.

10. The data processing apparatus of claim 1, further comprising a hierarchical memory system that includes a level one (L1) cache and a level two (L2) cache, wherein the memory is the L2 cache.

11. The data processing apparatus of claim 10, wherein the streaming engine is configured to provide for the transfer of the data elements of the data stream from the L2 cache to the processing core via a data path that does not include the L1 cache.

12. The data processing apparatus of claim 1, wherein the processing core includes a plurality of functional units to execute instructions received by the processing core and a register file coupled to and accessible by each of the functional units, the register file being separate from the buffer and the holding register of the streaming engine.

13. A system comprising:
a data processing device including:
a processing core;
a first memory coupled to the processing core;
a second memory coupled to the processing core; and
a streaming engine coupled to the second memory and configured to receive a plurality of data elements stored in the second memory and to provide the plurality of data elements as a data stream to the processing core in response to an instruction, wherein all of data elements of the data stream have a same data size, wherein the data size is specified by one or more control bits indicated by the instruction, and wherein the streaming engine includes:
an address generator to generate addresses corresponding to locations in the second memory;
a buffer to store the data elements received from the locations in the second memory corresponding to the generated addresses;
a holding register coupled to the buffer to store a set of data elements received from the buffer; and
an output to supply the set of data elements stored in the holding register to the processing core as the data stream.

14. The system of claim 13, wherein the streaming engine further includes a data formatter configured to format the data elements stored in the buffer according to specified stream definition, wherein the instruction identifies the specified stream definition and the one or more control bits are part of the specified stream definition.

15. The system of claim 13, wherein each data element of the data stream is of the same data element type and wherein all data elements of the data stream of the same data element size.

16. The system of claim 13, wherein the first memory is a level one (L1) cache of a hierarchical memory system and the second memory is a level two (L2) cache of the hierarchical memory system.

17. The system of claim 16, wherein the data processing device includes:
a first data bus coupled to the L2 cache and to the streaming engine, wherein the data elements stored in the buffer are received via the first data bus; and
a second data bus coupled to the output of the streaming engine and to the processing core, wherein the data stream is supplied to the processing core via the second data bus.

18. The system of claim 17, wherein the first data bus and the second data bus provides a data path for the data elements from the L2 cache to the processing core that does not include the L1 cache.

19. The system of claim 18, wherein the processing core is a digital signal processing (DSP) core.

20. The system of claim 13, wherein the processing core includes a plurality of functional units to execute instructions received by the processing core and a register file coupled to and accessible by each of the functional units, the register file being separate from the buffer and the holding register of the streaming engine.

21. A system comprising:
a data processing device including:
a processing core;
a first memory coupled to the processing core, wherein the first memory is a level one (L1) cache of a hierarchical memory system;
a second memory coupled to the processing core, wherein the second memory is a level two (L2) cache of the hierarchical memory system; and
a streaming engine coupled to the second memory and configured to receive a plurality of data elements stored in the second memory and to provide the plurality of data elements as a data stream to the processing core, the streaming engine including:
an address generator to generate addresses corresponding to locations in the second memory;
a buffer to store the data elements received from the locations in the second memory corresponding to the generated addresses;
a holding register coupled to the buffer to store a set of data elements received from the buffer; and
an output to supply the set of data elements stored in the holding register to the processing core as the data stream;
a first data bus coupled to the L2 cache and to the streaming engine, wherein the data elements stored in the buffer are received via the first data bus; and
a second data bus coupled to the output of the streaming engine and to the processing core, wherein the data stream is supplied to the processing core via the second data bus.

* * * * *